(12) United States Patent
Uno et al.

(10) Patent No.: US 7,390,370 B2
(45) Date of Patent: Jun. 24, 2008

(54) GOLD BONDING WIRES FOR SEMICONDUCTOR DEVICES AND METHOD OF PRODUCING THE WIRES

(75) Inventors: Tomohiro Uno, Futtsu (JP); Shinichi Terashima, Futtsu (JP); Kohei Tatsumi, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 643 days.

(21) Appl. No.: 10/502,676

(22) PCT Filed: Oct. 3, 2003

(86) PCT No.: PCT/JP03/12740

§ 371 (c)(1),
(2), (4) Date: Jul. 27, 2004

(87) PCT Pub. No.: WO2004/049425

PCT Pub. Date: Jun. 10, 2004

(65) Prior Publication Data

US 2005/0079347 A1    Apr. 14, 2005

(30) Foreign Application Priority Data

| Apr. 5, 2002 | (JP) | 2002-104340 |
| Jun. 24, 2002 | (JP) | 2002-182450 |
| Nov. 27, 2002 | (JP) | 2002-343766 |
| Feb. 3, 2003 | (JP) | 2003-026065 |

(51) Int. Cl.
C22C 5/02 (2006.01)

(52) U.S. Cl. .................. 148/430; 420/507; 428/364

(58) Field of Classification Search ............... 148/430; 428/364; 420/507–512
See application file for complete search history.

(56) References Cited

FOREIGN PATENT DOCUMENTS

| JP | 56-21354 | 2/1981 |
| JP | 59-48948 | 3/1984 |
| JP | 59-155161 | 4/1984 |
| JP | 2002-319597 | 10/2002 |

*Primary Examiner*—Roy King
*Assistant Examiner*—Janelle Morillo
(74) *Attorney, Agent, or Firm*—Kenyon & Kenyon LLP

(57) ABSTRACT

Gold bonding wires for semiconductor devices featuring increased strength and modulus of elasticity, stable loop shapes, suppressing the flow of wires, suppressing the leaning, and totally improved junctions of the wedge junction portions or wear characteristics for realizing a narrow-pitch connection, and enhanced the productivity on an industrial scale, and a method of producing the same. A gold bonding wire for a semiconductor device has a crystal grain structure in cross section in the lengthwise direction of the bonding wire, wherein a ratio of the area of crystal grains having an orientation [111] to the area of crystal grains having an orientation [100] is not smaller than 1.2 in the crystal orientations in the lengthwise direction of the wire.

22 Claims, 2 Drawing Sheets

LENGTHWISE DIRECTION OF THE WIRE

6 μm

GOLD BONDING WIRES FOR SEMICONDUCTOR DEVICES AND METHOD OF PRODUCING THE WIRES

TECHNICAL FIELD

The present invention relates to gold bonding wires, for semiconductor devices, used for connecting electrodes on a semiconductor element to external leads and to a method of producing the wires.

BACKGROUND ART

At present, bonding wires, made of highly pure 4N-type gold (purity>99.99% by mass) and having a wire diameter of about 20 to about 50 µm, are used for connecting electrodes on a semiconductor element to external terminals. An ultrasonic wave-combined thermal press-adhering system has generally been used as technology for connecting the bonding wires necessitating a generally employed bonding device and a capillary jig used for inserting the wires therein for connection. An end of a wire is heated and melted by arc heat input to form a ball utilizing the surface tension, the ball is press-adhered onto the electrode of the semiconductor element heated in a range of 150 to 300° C. and, then, the wire is directly wedge-joined to the external lead side by ultrasonic wave press-adhesion. In order for the device to be used as a semiconductor device such as a transistor or an IC, the device is molded with an epoxy resin after the wires are bonded to protect the silicon chip, the bonding wires and the lead frame of a portion on where the silicon chip is mounted. In addition to improving their properties, increasing importance has been placed on improving their relationship to the surrounding members and on improving overall performance such as use and reliability.

Accompanying the trend toward highly densely integrating the semiconductor element and decreasing the thickness, the gold bonding wires have to satisfy diverse properties, such as elongating the gold bonding wires, decreasing the thickness of the wires, forming high loops or forming low loops for decreasing the thickness of the semiconductor element.

A material to which the bonding wires are to be joined, too, is changing. The wiring and electrode materials on the silicon substrate now use Cu and a Cu alloy which are suited to being highly densely integrated, in addition to using the traditional Al alloy. Even in the electrode members of Al alloy, Cu and Cu alloy, it has been urged to employ a small ball junction to meet narrow pitches, and it is becoming important to maintain junction strength, ball deformation and reliability in a high-temperature junction.

To meet the demands for highly densely integrating the semiconductor elements, strict requirements have been placed on narrowing the pitch, decreasing the size of the wires, increasing the number of pins, increasing the length of the wires, and obtaining a high degree of junction property in connecting the gold bonding wires.

In, for example, a resin-molding step where a highly viscous thermosetting epoxy resin is injected at high speed, a problem arises in that the wires are deformed to come in contact with the neighboring wires. Besides, while pitches are becoming narrow, and wires are becoming long and fine, it has been desired to suppress the deformation of wires (hereinafter also called wire sweep), by even a small amount, at the time of being molded with the resin. It has been strongly demanded to narrow the pitch. At present, mass production is at a level of maintaining a pitch of 60 µm. A pitch of 50 µm has also been developed, and it is expected that a very narrow pitch of 45 µm, which several years ago was considered to be a limit of the ball junction, may be put into practice within two to three years. In a road map related to the mounting technology, it is expected that a technology for realizing a pitch of 20 µm will be realized in the future.

Among many kinds of semiconductor packages, BGAs (ball grid arrays) and CSPs (chip size packages) have narrow pitches. Their mounting forms are based on the use of a board and a tape having fewer limitations, such as reducing the gap among the leads, than that of the conventional lead frame structures. When the board and tape are to be used, attention must be given so that the junction can be effected at a bonding temperature in a temperature region of as low as 150 to 170° C. This is a drop in temperature by several tens of degrees in centigrade as compared to the bonding effected at 210 to 300° C. in the case of the lead frame. It has therefore been desired to accomplish a narrow-pitch junction at a low temperature. Due to a delay in diffusion at low temperatures, due to a decrease in the junction area and due to very fine capillary ends, both the ball junction and the wedge junction have to satisfy very strict properties and reliability.

As basic properties of the wires satisfying such a requirement, it has been desired that overall properties are satisfied, such that the loop shape can be highly precisely controlled in the step of bonding, the junction is improved relative to the electrode portions and to the lead portions, and deformation of wires is suppressed in the mounting step after the bonding step.

In order to reinforce the bonding wires, so far, it was common to add a plurality of alloy elements. In the highly pure gold bonding wires which are now the main stream, addition of the alloy elements is limited to several ppm to several tens of ppm to prevent oxidation of the ball portions or a rise in the electric resistance. Therefore, though the loop controllability and junction properties are superior, it is not still satisfactory concerning suppressing the wire deformation or the strength of the heat-affected portions (neck portions) at the time of forming the balls. In recent years, high alloy wires for which the amount of addition is increased to a total of about 1% have been used in some ICs. However, the effect for improving the wire deformation is not satisfactory at the time of molding with the resin, leaving a problem of a decrease in the junction to the leads.

As means for achieving a high degree of strength, there have been proposed multi-layer wires of metals which are different between the core portion and the outer peripheral portion. For example, Japanese Unexamined Patent Publication (Kokai) No. 56-21354 teaches wires obtained by covering Ag cores with Au, and Japanese Unexamined Patent Publication (Kokai) No. 59-155161 teaches wires having cores of an electrically conducting metal of which the surfaces are plated with Au. Upon use, in combination the metals which are different between the cores and the outer peripheral portions, it is expected that the wires will satisfy the requirements of a large strength and a high junction property compared with the wires made of a single material employed by products in general. In practice, however, there has not been reported any use of multi-layer wires for the semiconductors.

To meet the need for high-density mounting in the future, therefore, the wires should not be simply those that satisfy their individual requirements and it is urged to develop a material which improves the overall properties.

The wires that suit the narrow-pitch junction in which the gap among the neighboring electrodes is not larger than 50 µm must simultaneously satisfy the wedge junction property and a leaning property, which are new problems, yet favorably improve high strength and high elasticity, loop controllability, junction property while suppressing the wire sweep that is a traditional problems.

Concerning the wires for realizing the narrow-pitch connection, study has been forwarded, using a gold alloy, using a material to substitute for gold and using multi-layer wires. Described below are problems that are encountered when the narrow-pitch connection is to be realized on a mass-production level by employing the above methods.

By utilizing the curing by solid solution, curing by precipitation and curing by the formation of a compound due to the addition of alloy elements to gold, and mutual action relative to the dislocation, it is made possible to increase the strength required for the conventional wires to some extent. Even by simply adding alloy elements, however, there is a limit to increasing the strength or to increasing the modulus of elasticity and, besides, it becomes difficult to suppress the deformation of wires when molded with the resin. When the amount of wire sweep is as large as 5% or more in the conventional molding technology, an increase in the strength of the wires is effective for suppressing the wire sweep because the wire deformation takes place chiefly in the plastic region. Due to the recent development in the resin molding technology, on the other hand, the wire sweep is becoming dominated by the elastic deformation, and an increase in the modulus of elasticity is becoming ever more important. To increase the modulus of elasticity of the gold alloy wires to be not smaller than 88 MPa, however, the action of only a solid solution of alloy elements and of precipitation is not enough. Further, if elements are added at a high concentration in order to increase the strength and the modulus of elasticity, new problems arise, such as oxidation of wire surfaces, occurrence of cavities when the balls are formed, drop in the junction properties of the ball portions, excess increase in the electric resistance, etc.

According to the traditional method of selecting the kind and concentration of elements that are added for utilizing the solid solution of alloy elements added to the wire material, precipitation thereof and formation of a compound, it is quite difficult to apply the gold bonding wires for ball junction to the very narrow-pitch connection on a mass production basis.

The above multi-layer wires constituted by the cores and the outer peripheral portions may have different properties, between the cores and the outer peripheries, and different latent properties can be expected. However, the production of the multi-layer wires is so complex that there remain problems that have to be solved for mass production, such as an increase in the cost of production due to an increase in the steps and new facilities, as well as very difficult quality control such as homogenization and stabilization of properties. In the multi-layer wires, particular properties can be improved relatively easily. However, complex wire properties required for the narrow-pitch connection have not still been totally satisfied leaving problems that must be solved in practical use.

Therefore, none of gold alloy materials that substitute for gold and multi-layer wires satisfy all of the properties required for the narrow-pitch connection. The bonding wires for narrow-pitch junction must have a large strength, a high elasticity and a high rigidity for suppressing the wire sweep and must, at the same time, satisfy the conflicting properties of improving the loop controllability and junction, while lowering the cost and minimizing an increase in the electric resistance.

As the pitch becomes smaller than 40 μm, further, there arise new problems such as leaning of the ball erecting portions, that, so far, were not regarded as problems. In a multi-pin/narrow-pitch connection, different wire lengths and different loop heights exist in the mounting of a single IC. Unlike the conventional mounting employing the same loop shape in the chip, however, this tends to develop a problem related to loop control. The problem which is drawing the most serious attention in recent years is that the wire-erecting portions fall near the ball junction permitting the neighboring wires to approach too close. This phenomenon is called leaning and is becoming a major cause for lowering the mass productivity of narrow-pitch connection.

The leaning of the ball-erecting portions cannot be easily improved despite the strength and modulus of elasticity of the wires being simply increased or, conversely, despite the strength being decreased. Even if the elongation after fracture frequently used in the mechanical properties related to the bonding wires is increased or decreased, the leaning is not suppressed. This is because the ball-erecting portions have already been deformed and distorted due to the heat at the time of melting the balls and due to the formation of loops and are dominated by properties different from those of mother wire. Therefore conventional method of improvement based on the mechanical properties faces a limit. To cope with the leaning, a wire material must be developed based upon a new concept.

Further, the wires of which the strength is simply increased are not capable of fully satisfying the deforming property, junction strength and long-term reliability at the wedge junction portions in the highly dense connection such as a narrow-pitch connection. No problem occurred in the wedge junction when the pitch was not shorter than 70 μm in the prior art. In narrow-pitch connections in the future, however, it will become important to improve the wedge junction property.

The factors that induce problems related to the wedge junction stem from fine wires, greatly decreased junction areas due to fine capillary ends and low junction temperatures as the narrow-pitch connection is effected chiefly for the board and the tape. That is, the problem related to the wedge junction has not so far been seriously tackled and must, hence, be handled as a new problem for realizing narrow pitches.

The wedge junction forms a special junction structure very different from the deformation of ball portions, such as wires undergoing complex behavior at high speeds receiving large deformation, good junction strength is maintained to meet the counterpart to which the wire is to be joined, and stabilizing the cutting shape of the wires in the step of forming small balls for a narrow pitch after the wedge is joined. So far, the wedge junction was maintained without the need of taking the above phenomena into consideration. Therefore, the factors related to the wire materials for improving the wedge junction have not been clarified, and practical examples of wire products enhancing the wedge junction properties have not been reported. Rather, it has often been pointed out that the highly strengthened wires generally exhibit lowered wedge junction properties at low temperatures. For example, if the wires are simply strengthened by the addition at high concentrations, the operation margin decreases for maintaining the wedge junction property. To meet the demand for narrowing the pitch, it becomes an important technical assignment to use strong and fine wires and to improve the wedge junction property.

In the wedge junction portion, further, it is necessary to improve the reliability in use in addition to the junction property. The silicon chip, metal frame, bonding wires and molding resin for covering them have different coefficients of thermal expansion and moduli of elasticity, and tend to develop heat distortion. It is considered that the thermal strain concentrates in the wedge junction portion resulting in breakage during the reflowing, during use where heat is generated, or through temperature cycles such as repeated cooling. A problem occurs concerning the thermal fatigue at the side of the wires as the wires become fine and the wedge junctions become fine. Accompanying the use of Pb-free solder in recent years, further, the reflowing temperature is becoming high, thus accelerating thermal fatigue. The factors related to the wire materials have not been clarified for improving reliability in the wedge junction. Reliability during use, such as fatigue resistance of the wedge junction portions having a greatly deformed complex structure, is greatly different from that of the wire deformation and junction at the time of controlling the loops or molding required so far for the wires. Therefore, this is beyond the conventional simple design of materials such as components and concentrations thereof.

It is therefore an object of the present invention to provide gold bonding wires for semiconductor elements having a large strength and a high flexural rigidity suited for narrowing the pitch, decreasing the wire size and lengthening the wire, having an improved junction property and suited for mass-production on an industrial scale, and a method of producing the wires.

From the above-mentioned point of view, the present inventors have engaged in study and development in an attempt to totally improve the strength, modulus of elasticity, wedge junction property and to suppress the flow of wires for realizing a narrow-pitch connection, as well as to improve the leaning of the ball-erecting portions, and have discovered, for the first time, that controlling the aggregate structure of the wires is important and effective.

DISCLOSURE OF THE INVENTION

Described below are the gists of the invention for achieving the above-mentioned object of the present invention.

(1) A gold bonding wire for a semiconductor device wherein in a crystal grain structure in cross section in the lengthwise direction of the bonding wire, a ratio of the area of crystal grains having an orientation [111] to the area of crystal grains having an orientation [100] is not smaller than 1.2 in the crystal orientations in the lengthwise direction of the wire.

(2) A gold bonding wire for a semiconductor device wherein in a crystal grain structure in cross section in the lengthwise direction of the bonding wire, an area ratio of crystal grains having an orientation [111] is not smaller than 55% in the crystal orientations in the lengthwise direction of the wire.

(3) A gold bonding wire for a semiconductor device wherein in a crystal grain structure in cross section in the lengthwise direction of the bonding wire, if the radius of the wire is denoted by R and a portion up to R/2 from the center of the wire is regarded to be a central portion, then, a ratio Rc of the area of crystal grains having an orientation [111] to the area of crystal grains having an orientation [100] in the crystal orientations at the central portion in the lengthwise direction of the wire and a ratio Ra of the area of crystal grains having an orientation [111] to the area of crystal grains having an orientation [100] on the whole cross section of the wire, are such that an absolute value $|1-Rc/Ra|\times 100(\%)$ of a differential ratio between the two is smaller than 30%, and the ratio Ra is not smaller than 1.2 on the whole cross section of the wire.

(4) A gold bonding wire for a semiconductor device according to any one of (1) to (3), wherein in a crystal grain structure in cross section in the lengthwise direction of the bonding wire, if the radius of the wire is denoted by R, there exists, in at least one or more layers, a region in which a ratio of the area of crystal grains having an orientation [111] to the area of crystal gains having an orientation [100] is not smaller than 1.6 in the crystal orientations in the lengthwise direction of the wire maintaining a width of not smaller than 1/10 of the radius R of the wire in the radial direction of the wire.

(5) A gold bonding wire for a semiconductor device according to any one of (1) to (4), wherein in a crystal grain structure in cross section in the lengthwise direction of the bonding wire, if the radius of the wire is denoted by R, there exists, in at least one or more layers, a region in which an area ratio of crystal grains having an orientation [111] is not smaller than 60% in the crystal orientations in the lengthwise direction of the wire maintaining a width of not smaller than 1/10 of the radius R of the wire in the radial direction of the wire.

(6) A gold bonding wire for a semiconductor device according to any one of (1) to (3), wherein in a crystal grain structure in cross section in the lengthwise direction of the bonding wire, if the radius of the wire is denoted by R, there exists, in at least one or more layers, a region in which a ratio of the area of crystal grains having an orientation [111] to the area of crystal gains having an orientation [100] is smaller than 0.9 in the crystal orientations in the lengthwise direction of the wire maintaining a width of not smaller than 1/10 but smaller than 1/3 of the radius R of the wire in the radial direction of the wire.

(7) A gold bonding wire for a semiconductor device according to any one of (1) to (3) or (6), wherein in a crystal grain structure in cross section in the lengthwise direction of the bonding wire, if the radius of the wire is denoted by R, there exists, in at least one or more layers, a region in which an area ratio of crystal grains having an orientation [100] is not smaller than 50% in the crystal orientations in the lengthwise direction of the wire maintaining a width of not smaller than 1/10 of the radius R of the wire in the radial direction of the wire.

(8) A gold bonding wire for a semiconductor device according to any one of (1) to (7), wherein in cross section in the lengthwise direction of the bonding wire, a ratio of the sum of areas of crystal grains having an orientation [111] and an orientation [100] is not smaller than 50% in the crystal orientations in the lengthwise direction of the wire.

(9) A gold bonding wire for a semiconductor device according to any one of (1) to (8), wherein in cross section in the lengthwise direction of the bonding wire, if the radius of the wire is denoted by R and a portion up to R/2 from the center of the wire is regarded to be a central portion, a ratio of the sum of areas of crystal grains having an orientation [111] and an orientation [100] occupying the central portion is not smaller than 60% in the crystal orientations in the central portion in the lengthwise direction of the wire.

(10) A gold bonding wire for a semiconductor device wherein in a crystal grain structure in cross section in the lengthwise direction of the bonding wire, if the radius of the wire is denoted by R and a portion of a depth up to R/3 from the surface of the wire is regarded to be a surface layer portion, a ratio of the area of crystal grains having an orientation [111] to the area of crystal grains having an orientation [100] is not smaller than 1.6 in the crystal orientations in the surface layer portion in the lengthwise direction of the wire, and a ratio of the area of crystal grains having the orientation [111] to the area of crystal grains having the orientation [100] is not smaller than 1.2 on the whole cross section of the wire.

(11) A gold bonding wire for a semiconductor device according to any one of (1) to (10), wherein in cross section in the lengthwise direction of the bonding wire, if the radius of the wire is denoted by R and a portion up to R/3 from the surface of the wire is regarded to be a surface region, a ratio of the sum of areas of crystal grains having an orientation [111] and an orientation [100] occupying the surface region is not smaller than 50% in the crystal orientations in the surface region in the lengthwise direction of the wire.

(12) A gold bonding wire for a semiconductor device wherein, in the crystal orientation found by an x-ray diffraction measurement in cross section in the lengthwise direction or in the direction perpendicular to the lengthwise direction of the bonding wire, a volume ratio of the crystal grains having an orientation [111] to the crystal grains having an orientation [110] is not smaller than 1.2.

(13) A gold bonding wire for a semiconductor device according to any one of (1) to (12), wherein in cross section in the lengthwise direction of the wire greater by more than 5 times than the diameter of the bonding wire, there are included at least two or more crystal grains of which the crystal orientations are oriented within an angle of 15° in the lengthwise direction of the wire over a length of not smaller than 70% of the wire diameter.

(14) A gold bonding wire for a semiconductor device according to any one of (1) to (13), wherein the bonding wire contains Au as a chief component, contains one or more elements selected from Y, Ca, Yb and Eu at a total concentration $C_1$ of 0.002 to 0.03% by mass, and contains one or more elements selected from La, Tb, Dy and Nd at a total concentration $C_2$ of 0.002 to 0.05% by mass, the concentrations of the added components being in a range of $0.1<C_1/C_2<10$.

(15) A gold bonding wire for a semiconductor device wherein in a crystal grain structure in cross section in the lengthwise direction of the bonding wire, if the radius of the wire is denoted by R, a portion up to R/2 from the center of the wire is regarded to be a central portion and the outer side thereof is regarded as an outer peripheral portion, then, a ratio Rc of the area of crystal grains having an orientation [111] to the area of crystal grains having an orientation [100] in the crystal orientations at the central portion in the lengthwise direction of the wire and a ratio Rs of the area of crystal grains having the orientation [111] to the area of crystal grains having the orientation [100] in the crystal orientations in the outer peripheral portion in the lengthwise direction of the wire, are such that an absolute value $|1-Rc/Rs|\times100(\%)$ of a differential ratio between the two is not smaller than 30%.

(16) A gold bonding wire for a semiconductor device according to (15), wherein in a crystal grain structure in cross section in the lengthwise direction of the bonding wire, a ratio Ra of the area of crystal grains having an orientation [111] to the area of crystal gains having an orientation [100] is not smaller than 1.0 in the crystal orientations in the lengthwise direction of the wire.

(17) A gold bonding wire for a semiconductor device according to (15) or (16), wherein in a crystal grain structure in cross section in the lengthwise direction of the bonding wire, if the radius of the wire is denoted by R and a portion up to R/3 from the center of the wire is regarded to be a core portion, a ratio Rd of the area of crystal grains having an orientation [111] to the area of crystal grains having an orientation [100] is in a range of from 0.1 to 0.8 in the crystal orientations in the core portion in the lengthwise direction of the wire.

(18) A gold bonding wire for a semiconductor device according to any one of (15) to (17), wherein a ratio RS of the area of crystal grains having an orientation [111] to the area of crystal gains having an orientation [100] is not smaller than 1.2 in the crystal orientations in the outer peripheral portion of the bonding wire in the lengthwise direction of the wire.

(19) A gold bonding wire for a semiconductor device according to any one of (15) to (18), wherein in a crystal grain structure in cross section in the lengthwise direction of the bonding wire, if the radius of the wire is denoted by R and a portion up to R/5 from the surface of the wire is regarded to be the outermost portion, a ratio Rt of the area of crystal grains having an orientation [111] to the area of crystal grains having an orientation [100] is not larger than 1.0 in the crystal orientations in the outermost portion in the lengthwise direction of the wire.

(20) A gold bonding wire for a semiconductor device according to any one of (1) to (19), wherein an orientation [111] and an orientation [100] of the crystal grains are inclined within 10° with respect to the lengthwise direction of the bonding wire.

(21) A gold bonding wire for a semiconductor device according to any one of (1) to (20), wherein the number of crystal grains on a cross section perpendicular to the lengthwise direction of the bonding wire is from 0.04 to 4/$\mu m^2$.

(22) A method of producing a gold bonding wire for a semiconductor device from a cast material through a step of a combination of rolling, pre-heat treatment, secondary drawing and after-heat treatment, which are effected at least one time in this order, wherein an area working ratio in the rolling is not smaller than 95%, a heating temperature (absolute temperature) in the pre-heat treatment is in a range of 20 to 70% of the melting point of the cast material, an area working ratio in the secondary drawing is not smaller than 99.5%, and a heating temperature (absolute temperature) in the after-heat treatment is in a range of 20 to 70% of the recrystallization temperature of the cast material.

(23) A method of producing a gold bonding wire for a semiconductor device from a cast material through a step of a combination of rolling, primary drawing, pre-heat treatment, secondary drawing and after-heat treatment, which are effected at least one time in this order, wherein area working ratios in the rolling and in the primary drawing are not smaller than 95%, a heating temperature (absolute temperature) in the pre-heat treatment is in a range of 20 to 70% of the melting point of the cast material, an area working ratio in the secondary drawing is not smaller than 99.5%, an average stretching rate is 50 to 1000 m/min, a vessel temperature for drawing the wire is 5 to 45° C., a heating temperature (absolute temperature) in the after-heat treatment is in a range of 20 to 70% of the recrystallization temperature of the cast material, and a sweep tension is in a range of 0.2 to 70 mN.

(24) A method of producing a gold bonding wire for a semiconductor device according to (22) or (23), wherein among a plurality of dies used for the drawing, not less than 30% of the dies have an area reduction ratio of not smaller than 10%.

(25) A method of producing a gold bonding wire for a semiconductor device from a cast material through a step of a combination of rolling, primary drawing, pre-heat treatment, secondary drawing and after-heat treatment, which are effected at least one time in this order, wherein area working ratios in the rolling and in the primary drawing are not smaller than 95%, a heating temperature (absolute temperature) in the pre-heat treatment is in a range of 30 to 70% of the melting point (absolute temperature) of the cast material, an area working ratio in the secondary drawing is not smaller than 99.5%, an average drawing rate is 100 to 800 m/min, a difference in the tension before and after the dies is in a range of 0.1 to 50 MPa, a heating temperature (absolute temperature) in the after-heat treatment is in a range of 30 to 70% of the recrystallization temperature (absolute temperature) of the cast material, and drawing angles at the die outlets in the primary drawing and in the secondary drawing are not larger than 30°.

(26) A method of producing a gold bonding wire for a semiconductor device according to (25), wherein among a plurality of dies used for the drawing, not less than 10% of those are a group of three kinds of dies having area reduction ratios of smaller than 7%, 7 to 11%, and 11 to 20%.

(27) A method of producing a gold bonding wire for a semiconductor device according to (25) or (26), wherein in the after-heat treatment, the wire is continuously swept and is heat-treated by using a heating furnace having such a temperature profile that a heating temperature Te (absolute temperature) at both ends of the heating furnace is lower than a heating temperature Tm (absolute temperature) at the central portion by 0.02 Tm to 0.3 Tm.

BEST MODE FOR CARRYING OUT THE INVENTION

Figure 1:
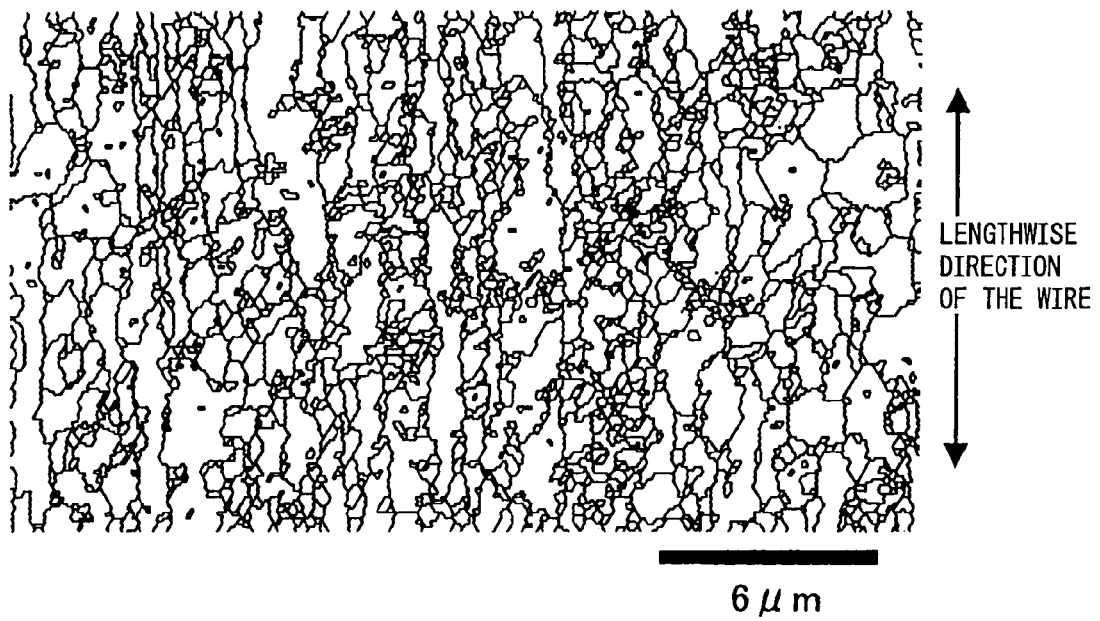
FIG. 1 is a view illustrating crystal grain boundaries of a gold bonding wire (wire diameter of 25 μm) as measured by EBSP.

By giving attention to a relationship between the aggregate structure of the gold bonding wire and a narrow-pitch wire junction which had so far been almost known, the inventors have discovered, for the first time, that the individual characteristics can be improved such as the strength, modulus of elasticity, loop controllability, junction and suppress of wire sweep and, besides, overall improvement can be accomplished in the group of properties which could not be accomplished and, further, problems inherent in the narrow-pitch connection can be solved, such as wedge junction property, reliability in the wedge junction and reduction of leaning in the ball-erecting portion as a result of controlling particular crystal orientations, a ratio of particular crystal orientations and a profile of crystal orientations in the wire.

Described below are the gold bonding wires for semiconductor devices and the method of producing the same as set forth in (1) to (14), (20) and (22) of the invention.

The bonding wire has a fibrous aggregate structure extending in the lengthwise direction of the wire. The strength and modulus of elasticity can be enhanced by selecting a ratio of the area of crystal grains having an orientation [111] to the area of crystal grains having an orientation [100] to be not smaller than 1.2 in the crystal orientations in the lengthwise direction of the wire. It was confirmed that a strength of not smaller than 300 MPa and a modulus of elasticity of not smaller than 90 MPa could be achieved. In controlling the orientation of the aggregate structure, in particular, the modulus of elasticity increases more effectively than the strength, which the conventional design of the material based on the addition of elements could not achieve.

Upon achieving a large strength and a high modulus of elasticity, it becomes possible to lower the wire sweep at the time of being molded with a resin by more than 20% as compared to that of the conventional material. This presents a probability of using very fine wires of a diameter of not larger than 15 μm necessary for narrowing the pitch to be not larger than 40 μm. Besides, the diameter of the wire can be decreased by not less than 10% yet maintaining the same strength offering a great advantage even from the standpoint of lowering the material cost.

By so controlling the structure as to increase the ratio of the orientation [111] of crystal grains rather than increasing the orientation [100] of crystal grains, it is possible to increase the strength and the modulus of elasticity as well as to favorably accomplish the properties of forming balls that so far involved problems when it was attempted to increase the strength by adding elements at high concentrations. For example, even in forming small balls having a ratio of ball diameter/wire diameter 1.3 to 1.6, the balls feature favorable sphericity and are advantageous for the connection maintaining a pitch as narrow as not larger than 40 μm. This is attributed to that, as the orientation is controlled not only for the orientation [111] but also for the orientation [100], the wire structure affects not only the wire fracture property after the wedge junction but also the formation of structure at the time when the balls are solidified.

The orientation in the orientation [111] affects not only the strength but also helps increase the tensile strength and the yield strength. Therefore, when a large load is exerted on the wires at the time of being molded with the resin or when the wires are long, the start of plastic deformation of the wire is effectively suppressed. So far, the strength could be increased to some extent by increasing the amount of addition of alloy-forming elements in the wires accompanied, however, by a problem of an increase in the electric resistance of the wires due to the addition at high concentrations. In the future, it is essential that ICs are designed to work at high frequencies and, hence, an increase in the electric resistance of the wires could decrease the function of the semiconductor. In contrast, a wire controlling the orientation of the orientation [111] and the orientation [100] of crystal grains features an increased strength without increasing the electric resistance and offers a great advantage inclusive of being applied to high-function LSIs such as ASICs and the like.

A ratio of the area of crystal grains having an orientation [111] to the area of crystal grains having an orientation [100] (abbreviated in the following description as area ratio [111]/[100]) is selected to be not smaller than 1.2. This is because, if the area ratio is smaller than 1.2, only a small effect for suppressing the wire sweep is obtained by an increase in the modulus of elasticity. Desirably, the area ratio [111]/[100] is not smaller than 1.4. This is because, if the area ratio is not smaller than 1.4, an increased effect is obtained for suppressing the wire sweep. More desirably, the area ratio [111]/[100] is selected to be not smaller than 2.5 to increase the modulus of elasticity and the flexural rigidity and, hence, to further increase the effect for suppressing the wire sweep. Though there is no particular upper limit on the area ratio [111]/[100], the wires can be produced stably and relatively easily provided if the upper limit is smaller than 20. This is because it is difficult to completely remove the crystal grains having the orientation [100] leaving only those crystal grains having the orientation [111] on the mass production level.

For comparison, a gold bonding wire which has been generally used was observed for its structure to learn that the area ratio [111]/[100] was smaller than 1.2. Even the wires classified as very strong wires possessed a ratio of smaller than 1.1 when they were stably produced on an industrial scale.

In the present invention, the crystal orientation has an angular difference of not larger than 10° relative to the lengthwise direction of the wire. Namely, within this range, the wire exhibits properties in its respective orientations making it possible to effectively utilize the effects upon the properties of the bonding wire. If the angular difference of the crystal orientation exceeds 10°, a difference may occur in the effect upon the wire properties.

With the bonding wire having an area ratio of crystal grains of the orientation [111] of not smaller than 55% in the crystal orientations in cross section in the lengthwise direction of the wire, it is possible to increase the strength and the modulus of elasticity as well as to improve the linearity of the loop to enhance the practicability of narrow-pitch connection.

In forming the loops of bonding wires, the loops can be regularly formed by favorably utilizing the elastic deformation and plastic deformation relying upon a complex locus of loop. The loop in a direction perpendicular to the semiconductor chip includes straight portions, curved portions and folded portions in combination. On the other hand, the loop in a horizontal direction relative to the semiconductor chip has a straight shape. It is desired that the loop is plastically deformed in the vertical direction so as to be curved and folded, and maintains the linearly as far as possible in the horizontal direction. As the wires become finer in the future, it is probable that the linearity may decrease. In the conventional design of the materials relying upon the addition of elements, it was difficult to maintain both the linearity and a complex loop shape having curved portions and folded portions.

Upon controlling the structure by giving attention to the crystal grains having the orientation [111], therefore, the conflicting properties, such as curving and folding in the vertical direction and linearity in the horizontal direction can be effectively satisfied simultaneously. If the area ratio of the crystal grains having the orientation [111] is not smaller than 55%, the curved portions and folded portions can be favorably controlled in a complex loop shape such as a triangular loop, a trapezoidal loop or a stepped loop while, at the same time, improving the linearity of the loop.

More preferably, it is desired that the bonding wire has an area ratio of crystal grains having the orientation [111] of not smaller than 55% in the crystal orientations in the lengthwise direction of the wire, and a ratio of the area of crystal grains having the orientation [111] to the area of crystal grains having the orientation [100] of not smaller than 1.2. This is because, upon selecting the ratio of the area of crystal grains having the orientation [111] to the area of crystal grains having the orientation [100] to be not smaller than 1.2 in addition to specifying the area ratio of the crystal grains having the orientation [111], it is possible to suppress the deformation of wires at the time of being molded with the resin and to improve the yield of narrow-pitch connection in the mass production.

Further, with the area ratio of crystal grains having the orientation [100] being in a range of 3 to 20%, it becomes easy to control the loop at high speeds, to decrease dispersion in the shape of the highest portions, to widen proper range of junction conditions such as load, ultrasonic oscillation, etc., making it possible to increase the yield of bonding in the mass production. Namely, relying upon the orientation [100] only, it may often become difficult to control the deformation of wires when an external force is exerted from a direction perpendicular to the lengthwise direction of the wire. Upon selecting the area ratio of crystal grains having the orientation [100] to lie in a range of 3 to 20%, the loops can be smoothly controlled, the elastic deformation can be smoothly transformed into plastic deformation at the time of joining the wires, and the productivity is enhanced. If the area ratio of the orientation [100] is smaller than 3%, the above-mentioned effect is small. On the other hand, the area ratio of the orientation [100] in excess of 20% may suppress the effect for increasing the strength and the modulus of elasticity based on the crystal grains having the orientation [111].

The bonding wire which must satisfy many requirements cannot be improved by simply controlling the structure in average on the cross section as a whole. To improve the leaning and sliding property which were considered to be difficult to achieve, it was found that an effective way is to control the crystal orientation at each of the portions by dividing the wire into a central region and a surface region, in cross section. Described below is a method to control the structure to improve the leaning and sliding properties.

As for the leaning of wire at the erected portion near the ball junction, a problem frequently arises when the connection is effected while maintaining a pitch as narrow as not larger than 50 μm. While the linearity represents an average straight line of the whole loop, the leaning corresponds to a local straight line which, concretely speaking, occurs in a region near the ball junction where the gap is the narrowest between the neighboring wires and where the curvature and folding are most severe in the vertical direction. Suppressing the leaning of the wire at this portion becomes an important assignment in the technology of narrow-pitch connection in mass production. The leaning could not be improved relying simply upon the high strength, high modulus of elasticity and elongation after fracture, which are the mechanical properties of the wire.

It has been desired to prevent the leaning in the transverse direction despite being considerably deformed and distorted due to the curving and folding in the vicinity of the ball junction. Relying upon the conventional method which is based on the mechanical properties, however, it is difficult to improve the leaning. Further, controlling the crystal orientation, on average, in the cross section of the wire is not enough to improve the leaning to a sufficient degree. It was, however, discovered that enhancing the homogeneity of crystal orientation in the cross-section of the wire is effective and, particularly, controlling the structure in the central region of the wire is effective in decreasing the leaning of wires at the erected portions near the ball junctions.

That is, in the crystal orientation in the lengthwise direction of the wire, if the radius of the wire is denoted by R and a portion up to R/2 from the center of the wire is regarded to be a central portion, then, the leaning is improved by setting a ratio Rc of the area of crystal grains having an orientation [111] to the area of crystal grains having an orientation [100] in the crystal orientation at the central portion in the lengthwise direction of the wire and setting a ratio Ra of the area of crystal grains having an orientation [111] to the area of crystal grains having an orientation [100] on the whole cross section of the wire, such that an absolute value |1−Rc/Ra|×100(%) of a differential ratio between the two is smaller than 30%, and by setting the ratio Ra to be not smaller than 1.2 on the whole cross section of the wire.

Here, concerning the area ratio [111]/[100], the ratio Ra on the whole cross section of the wire is set to be not smaller than 1.2 and, besides, the absolute value |1−Rc/Ra| of a differential ratio between the ratio Rc at the central portion and the ratio Ra on the whole cross section of the wire is suppressed to be smaller than 30% to enhance the homogeneity of the texture on the whole cross section of the wire. In ordinarily forming the loop by freely deforming the wire in four directions after the ball has been joined to the chip portion, therefore, the wire is suppressed from leaning at the erected portion. Concerning the homogeneity, further, attention is given to the area ratio [111]/[100], particularly, at the central portion to improve the leaning and resin flow property without impairing wire productivity, junction and usability of loop shapes.

Next, described below is a method to improve properties by controlling the texture near the wire surfaces.

When fine wires are used to realize a very narrow pitch, of not larger than 40 μm, in mass production, the gap becomes small between the hole of the capillary and the wire, and the sliding resistance increases to a degree which cannot be neglected. Besides, it is necessary to take into consideration the shock which the $SiO_2$ powder filler, occupying not less than 80% of the molding resin, gives to the wires at the time of molding and an accompanying increase in wire sweep. It is therefore desired to improve the sliding property between the wires and the capillaries, and to increase the rigidity of the wires so that the wires withstand shock at the time of being molded with the resin and the wire sweep is reduced. In addition to improving the strength, the modulus of elasticity, the linearity of loop shape and leaning property, which are for improving the narrow-pitch wire bonding properties, it is further necessary to improve the sliding property and rigidity, which, however, cannot be accomplished only by the conventional design of components. The inventors have discovered that the above requirements can be effectively accomplished by further controlling the profile of crystal orientations in the surface layer portion of the wire in addition to controlling the structure, on average, on the cross-section of the wire.

Concretely speaking, if the radius of the wire is denoted by R and a portion of a depth up to R/3 from the surface of the wire is regarded to be a surface layer portion, the strength and modulus of elasticity are enhanced, the wire sweep is suppressed, the loop shape is controlled, sliding property is improved and rigidity is enhanced all simultaneously by setting a ratio of the area of crystal grains having an orientation [111] to the area of crystal grains having an orientation [100] to be not smaller than 1.6 in the crystal orientations in the surface layer portion in the lengthwise direction of the wire, and by setting a ratio of the area of crystal gains having an orientation [111] to the area of crystal grains having an orientation [100] to be not smaller than 1.2 on the whole cross section of the wire.

By setting the ratio of the area of crystal grains having an orientation [111] to the area of crystal grains having an orientation [100] to be not smaller than 1.6, it is possible to decrease the slide resistance to the capillaries, to improve loop controllability of very fine wires having a diameter of not larger than 15 μm, to suppress the occurrence of scars on the surfaces of the wires and to improve the surface state of the wires caused by the collision with the filler at the time of being molded with the resin. In addition to controlling the structure in the surface layer portion, the structure is so formed that the area ratio [111]/[100] becomes not smaller than 1.2 on the whole cross section of the wire, in order to increase the rigidity and to suppress the wire sweep at the time of being molded with the resin. The area ratio [111]/[100] in the surface layer portion is set to be not smaller than 1.6. This is because, if the area ratio is smaller than 1.6, the sliding property and rigidity are not much improved. Here, the boundary between the central portion and the surface layer portion is distinguished at R/3 from the surface of the wire to define the profile of crystal orientations to make sure the effect most efficient for improving the sliding property and rigidity. More desirably, the area ratio [111]/[100] in the surface layer portion is set to be not smaller than 2.5 and the area ratio [111]/[100] on average is set to be not smaller than 1.2 on the whole cross section to obtain enhanced effect for improving the sliding property and suppressing the flow of wires, simultaneously.

To cope with the trend toward increasing the pins and decreasing the pitch, it has frequently been attempted to effect the wire connection having different wire lengths and different loop heights in a single IC accompanied by problems due to dispersion in the height of the loops. If, for example, the loop shapes remain stable at all times, the probability of contact among the wires can be decreased by alternately changing the height of the loops among the neighboring wires. With the presently employed wires, however, a limitation is imposed on controlling the height of the loops maintaining precision. In the conventional mounting structure having wire lengths of as short as about 3 mm, the loop height was dominated by the portions affected by heat near the balls, and the height of the loop could be controlled relatively easily. In a modern multi-pin narrow-pitch connection, on the other hand, the wire lengths are increasing to exceed 5 mm, the loop heights vary over a wide range, and it is becoming very important to decrease the dispersion in the height of the loops.

To lower the dispersion in the height of the loops, it was discovered that it is necessary to control the structure of the wires and, besides, the number of crystal grains per a unit area plays a large role in addition to controlling the crystal orientation such as the orientation [111] or the orientation [100] described above. Namely, it was confirmed that when the number of crystal grains is from 0.04 to 4/μm² on a cross section perpendicular to the lengthwise direction of the bonding wire and the area ratio [111]/[100] is not smaller than 1.4 on the whole cross section in the crystal orientations in the lengthwise direction of the wire, the strength can be increased, dispersion in the loop height can be decreased even when the wire length exceeds 5 mm, and the loops can be favorably controlled. Here, a range is selected for the number of crystal grains. This is because if the number of crystal grains is smaller than 0.04/μm², the loop shapes tend to be dispersed when a difference in the orientation of crystal grains that neighbor each other. Besides, it becomes difficult to homogeneously form crystal grains which are as fine as 4 or more grains per μm² over the whole wire through the ordinary step of producing the bonding wires.

In addition to average ratios of crystal orientations in the whole and partial regions of the wire described above, the aggregate structure of the bonding wire may further contain a region in which the crystal orientations are well oriented in order to further increase the strength, modulus of elasticity, loop controllability and property for suppressing the wire sweep.

The linearity of the wire formed as a loop can be further improved when the bonding wire has an area ratio [111]/[100] of not smaller than 1.2 in the whole wire, and has, in at least one or more layers, a region having a width of not smaller than 1/10 the radius R of the wire and having an area ratio [111]/[100] of not smaller than 1.6 in the radial direction of the wire. This is because, in a layer in which the area ratio [111]/[100] is not smaller than 1.6, the crystal orientations are oriented to exhibit a high modulus of elasticity. It is further considered that the linearity of wire is improved as a result of suppressing an increase in the dislocation due to the deformation of the wire and suppressing the distortion due to the working. Here, the above effect is efficiently obtained when the layer in which the area ratio [111]/[100] is not smaller than 1.6 exists maintaining a width of not smaller than 1/10 the radius R of the wire in the radial direction of the wire. A higher effect is obtained when the area ratio [111]/[100] is not smaller than 2, and the width of the layer is not smaller than 15% of the radius R of the wire in the radial direction of the wire. It is essential that there exists one or more layers in which the orientations are oriented. More desirably, there should be two or more layers.

Similarly, further, the strength and modulus of elasticity can be increased and the linearity can be further improved when the wire has, in at least one or more layers, a region in which the area ratio of the crystal grains having the orientation [111] is not smaller than 60% maintaining a width of not smaller than 1/10 the radius R of the wire in the radial direction of the wire. Here, the modulus of elasticity can be further increased by setting the area ratio of the crystal grains having the orientation [111] to be not smaller than 60% as compared to when the area ratio [111]/[100] is set to be not smaller than 1.6. The effect of improving the linearity is also confirmed even by connecting fine wires of a diameter of smaller than 20 µm, with which the linearly could not be maintained so far, maintaining a length of not shorter than 3 mm.

Further, the stability in forming the loops can be further improved when the bonding wire has an area ratio [111]/[100] of not smaller than 1.2 in the whole wire in the crystal orientations in the lengthwise direction of the wire and has, in at least one or more layers, a region in which an area ratio [111]/[100] is smaller than 0.9 maintaining a width of not smaller than 1/10 but smaller than 1/3 the radius R of the wire in the radial direction of the wire. When the loops are formed at high speeds, the plastic deformation of the wires becomes irregular in the lengthwise direction of the wire and in the direction perpendicular thereto increasing a dispersion in the shape of the loops. In a region where the area ratio [111]/[100] is smaller than 0.9, it is considered that the crystal orientation is oriented as [100] and the shape of the loops is stabilized owing to the action for relaxing the irregularity in the plastic deformation. Here, an enhanced effect is obtained when there exists a layer in which the area ratio [111]/[100] is smaller than 0.9 maintaining a width of not smaller than 1/10 the radius R of the wire in the radial direction of the wire. When the width of the above layer becomes greater than 1/3 the radius R of the wire, on the other hand, it becomes difficult to control the loops. This effect is obtained not only with fine wires but also with thick wires having a diameter of not smaller than 30 µm. More desirably, a further enhanced effect is obtained when the area ratio [111]/[100] is smaller than 0.6 and the width of the layer is not smaller than 15% of the radius R of the wire in the radial direction of the wire. It is essential that there exists one or more layers in which the orientations are oriented. Preferably, there should exist two or more layers.

Similarly, to further improve the loop controllability, the bonding wire should have an area ratio [111]/[100] of not smaller than 1.2 in the whole wire and should have, in at least one or more layers, a region in which an area ratio of crystal grains having the orientation [100] is not smaller than 50% maintaining a width of not smaller than 1/10 the radius R of the wire in the radial direction of the wire, making it possible to further enhance the effect for stabilizing the shape of the loops. That is, owing to an increase in the crystal grains in the orientation [100], it is possible to decrease the dispersion in the height of the loop and to improve the linearity. This makes it possible to cope with an increase in the bonding speed and to easily control the loops, while maintaining stability, even if the speed of bonding the wire is increased to be as high as 0.1 second or shorter in the future.

The wire is totally or partly controlled concerning not only the area ratio [111]/[100] described above but also concerning the sum of the area ratios of crystal grains of [111] and [100], in order to further enhance the strength, modulus of elasticity, loop controllability and property for suppressing the wire sweeps, and to improve the narrow-pitch connection in the mass production.

The effect can be enhanced for improving the wedge junction while lowering defective wire bonding if the bonding wire has, in the crystal structure in the lengthwise direction of the wire, an area ratio [111]/[100] of not smaller than 1.2 in the crystal orientations in the lengthwise direction of the wire in the whole wire and has a ratio of the sum of areas of crystal grains having an orientation [111] and an orientation [100] of not smaller than 50%. When the fine bonding wires are connected to the Au/Ni plating on the BGA board at a low temperature and maintaining a narrow pitch, it is likely that the wedge junction is deteriorated. The plasma cleaning on the board is effective as means for improving the strength of the wedge junction portion accompanied, however, by the occurrence of defective folding due to the plastic deformation of the wires as a result of an improved wedge junction. So far, a problem concerned to the improved wedge junction and the decreased defective wire folding, had not almost been known. This problem appears when the fine wires are connected onto the board maintaining a narrow pitch, and it is desired to solve this problem in order to promote the narrow-pitch connection in mass production.

It was discovered that adjusting the area ratio [111]/[100] only is not enough for simultaneously solving both the wedge junction and the wire folding, and that the effective way is to set the area ratio Pm of the sum of crystal grains [111] and [100] to be not smaller than 50% in the whole wire. Controlling the area ratio Pm of the sum of crystal grains [111] and [100] offers such advantages as controlling the behavior of deformation of wires at the time of wedge junction, enhancing the junction to the plating, and decreasing the wire folding by decreasing the shock load given to the wires at the time of cutting the tails of the wires after the wedge junction. Here, if the sum of the area ratios of crystal grains of [111] and [100] is smaller than 50%, limitation is imposed on a range of proper bonding conditions for improving the wedge junction and the wire folding. Desirably, if Pm is not smaller than 60%, the effect can be further enhanced for improving the wedge junction at a temperature of not higher than 165° C. which is adapted to connecting the board. More desirably, if Pm is not lower than 70%, the adaptability to narrowing the pitch can be further enhanced to be smaller than 40 µm by improving the wedge junction with fine wires of not thicker than 18 µm while decreasing the defective wire folding.

In addition to improving the linearity, the breakage in the wire can be decreased during the production of the wires, dispersion can be decreased in the mechanical properties in the lengthwise direction of the wire and the yield of fine wire production can be increased if the bonding wire has an area ratio [111]/[100] of not smaller than 1.2 in the whole wire in the crystal orientations in the lengthwise direction of the wire and, if a portion up to R/2 from the center of the wire having a radius R is regarded to be a central portion, and has a ratio Pc of the sum of the areas of crystal grains having the orientation [111] and the orientation [100] occupying the central portion of not smaller than 60% in the crystal orientations at the central portion in the lengthwise direction of the wire.

As a result of searching the yield at the time of production, the inventors have discovered that a simple control of the area ratio [111]/[100] is not enough, the structure at the central portion from the center of the wire up to R/2 plays an important role for the improvement, and an effective way is to set the ratio Pc of the total area of grain particles having the orientation [111] and orientation [100] occupying the central portion to be not smaller than 60%. Desirably, if Pc is not smaller than 70%, the effect can be further enhanced for stabilizing the mechanical properties. More preferably, if Pc is not smaller than 80%, the breakage of wires can be decreased and the yield of production can be further increased. Upon increasing the production yield of fine wires, the wire can be stably supplied as a product to cope with the mass production. It is further expected that a user who uses the wires receives an increased advantage.

The effect can be enhanced for suppressing the dispersion in the wire sweep ratio at the time of being molded with the resin if the bonding wire has an area ratio [111]/[100] of not smaller than 1.2 on the cross section in the lengthwise direction of the bonding wire and in the crystal orientations in the lengthwise direction of the wire in the whole wire and, if a portion up to R/3 from the surface of the wire having a radius R is regarded to be a surface region, has a ratio Ps of the sum of areas of crystal grains having an orientation [111] and an orientation [100] occupying the surface region of not smaller than 50% in the crystal orientations in the surface region in the lengthwise direction of the wire.

To decrease the defective wire contact in the step of molding with the resin, it was found that decreasing the dispersion in the wire sweep ratio is an effective way in addition to decreasing the wire sweep described above. Here, the wire sweep ratio is generally a value obtained by dividing the amount of deformation of the wire after molded by the wire length. The cause of assisting the dispersion in the wire sweep ratio is attributed to the direction of resin flow being not definite in the metal mold, and the wire sweep ratio varies individually depending upon the direction of external force exerted on the wire lengths. In order to stabilize the wire sweep ratio in the irregular behavior of resin flow, it was found that the effective way is to control the structure in the surface region up to R/3 from the wire surface in addition to setting the area ratio [111]/[100] to be not smaller than 1.2 in the whole wire and, particularly, to set the ratio Ps of the total area of crystal grains of the orientation [111] and orientation [100] occupying the surface region to be not smaller than 50%. Here, the ratio Ps is set to be not smaller than 50%. This is because if Ps is smaller than 50%, the effect is small for decreasing a standard deviation in the sweep ratio. Desirably, Ps is not smaller than 60% so that the wire sweep ratio is stabilized even when the wire length has a span as long as 4 mm or more. More desirably, Ps is not smaller than 70% to enhance the above effect with fine wires, not thicker than 18 µm, to further enhance the connection maintaining a pitch as narrow as not larger than 40 µm, in mass production.

In controlling the area ratio of the sum of the orientation [111] and the orientation [100], the above-mentioned effect can basically be obtained even for crystal orientations other than the particular orientations. As the crystal orientations other than the orientation [111] and the orientation [100], the orientation may be in such orientations as [110], [112] and [122] to obtain the effect for suppressing the occurrence of cracks in the wire surfaces. If the loops are strictly controlled to form low loops, the neck portions may be damaged by receiving heat near the balls. Damage to the neck portions cannot be decreased even by simply adjusting the mechanical properties such as the strength of the wires or even by simply controlling the area ratio [111]/[100] on the side of the structure in the whole wire. In addition to controlling the orientation [111] and the orientation [100], therefore, the orientation may be effected in the orientations [110], [112] and [122] to lower the damage to the neck portions and to realize low loops.

In finding the ratio of crystal orientations, further, it is desired that the wire lengths being observed are judged in a length of at least not smaller than the wire diameter in the lengthwise direction of the wire. More desirably, the wire lengths are measured in a length of not smaller than 1.5 times the diameter of the wire to obtain an average data to enhance the reproduceability of measurement. To examine the orientation of a crystal orientation in local regions in the wire, further, it is desired that the length to be observed is selected to be not smaller than 1.5 times of the wire diameter and, more preferably, not smaller than 3 times thereof.

In cross section of the wire in the lengthwise direction thereof of 5 or more times of the wire diameter, the crystal grains are made present in a number of at least two or more with its crystal orientation being oriented at angles of within 15° over the length of not smaller than 70% of the wire diameter in the lengthwise direction of the wire, in order to increase the strength, modulus of elasticity and to decrease the wire sweep due to the resin. In the whole wire or in the local region of the wire, the lengths of the crystal grains of which the crystal orientations are oriented are maintained to a sufficient degree in addition to controlling the average crystal orientations of many crystal grains or the ratio thereof, in order to further enhance the mechanical properties.

Here, in ordinarily observing the structure, a region where the angular differences are oriented within a range of about 15° is regarded to be a crystal grain. When the wire is deformed due to an external force in the step of forming the loops and being molded with the resin, the curvature is greater than the wire diameter in most deformations. To suppress the deformation, therefore, it is desired that the lengths of the crystal grains having oriented crystal orientations are not smaller than 70% of the wire diameter, and a fibrous structure is possessed in the lengthwise direction Next, described below are bonding wires of the invention set forth in (15) to (21) above.

The bonding wire has a fibrous aggregate structure extending in the lengthwise direction of the wire. By giving attention to a crystal grain structure in cross section in the lengthwise direction of the bonding wire, if the radius of the wire is denoted by R, a portion up to R/2 from the center of the wire is regarded to be a central portion and the outer side thereof is regarded as an outer peripheral portion, then, a ratio Rc of the area of crystal grains having an orientation [111] to the area of crystal grains having an orientation [100] (hereinafter abbreviated as an area ratio [111]/[100]) in the central portion and an area ratio RS [111]/[100] in the outer peripheral portion, are such that an absolute value |1−Rc/Rs|×100(%) of a differential ratio between the two is not smaller than 30%, in order to effect the connection at a low temperature and to enhance the wedge junction when the pitch is narrowed. In particular, the orientation control of the aggregate structure has a feature of improving the strength and modulus of elasticity while achieving the deformation of wedge junction portions and the junction strength, which could not be accomplished by the conventional design of materials based on the addition of elements.

Therefore, even when very fine wires are used having a diameter of not larger than 20 µm necessary for achieving a very narrow pitch of not larger than 50 µm, the wire sweep when molded with the resin can be decreased by more than 10% as compared to that of using the conventional material and, besides, the junction temperature can be lowered by more than 30° C. to maintain the continuous junction to a sufficient degree. Therefore, the resin board and the tape are not exposed to excess high temperatures, and the productivity and reliability are totally improved to a large extent.

The effect of orientation of crystal orientation will now be briefly described. Upon increasing the orientation toward the orientation [111], the effect can be enhanced for increasing the yield strength in addition to increasing the tensile strength, which, however, is not often enough to maintain the narrow-pitch junction at low temperatures. By utilizing the orientation toward the orientation [100], therefore, it is attempted to improve the wire formation at the time of wedge junction, cutting of tail portions and formation of balls by arc discharge.

Controlling the orientation of orientation [111] and orientation [100] of crystal grains is effective in suppressing the plastic deformation of wires at the time of being molded with the resin when the wires have increased lengths. So far, the strength could be increased to some extent by increasing the amount of alloy-forming elements in the wire. However, addition of elements at high concentrations is accompanied by an increase in the electric resistance of the wires at all times. In the future, it is essential that the ICs are designed to work at high frequencies, and an increase in the electric resistance of the wires becomes a cause of decreasing the semiconductor functions. On the other hand, the wire controlling the orientation of orientation [111] and orientation [100] of crystal grains exhibits an increased strength without increasing the electric resistance, and offers a great advantage inclusive of application to a high-function LSI such as an ASIC.

Upon controlling the orientation of not only the orientation [111] but also the orientation [100], i.e., upon controlling the wire structure by giving attention to the area ratio [111]/[100], it is possible to totally control the wedge junction, control the loops and to use fine wires having an increased strength. That is, upon controlling the area ratio [111]/[100], it is possible to increase the strength and the modulus of elasticity and, hence, to simultaneously accomplish favorable properties for forming balls that, so far, involved a problem when it was attempted to increase the strength by adding elements at a high concentration. For instance, even in forming small balls having a ratio of ball diameter/wire diameter of 1.2 to 1.6, which could not be stably formed, the balls maintain good sphericity and are advantageously used for the narrow-pitch connection. This is attributed to that controlling the crystal grains of the orientation [111] and orientation [100] affects the breaking of wires after the wedge junction and affects the formation of the structure when the balls are solidified.

The structure that produces a difference between the central portion of the wire and the outer peripheral portion is controlled concerning the area ratio [111]/[100] to simultaneously improve the conflicting requirements, i.e., to increase the strength and to enhance the junction property, which could not be accomplished by using the traditional wire materials. The area ratio [111]/[100] is increased at the outer peripheral portion to increase the strength and the modulus of elasticity while suppressing the wire sweep. Further, an increase in the area ratio [111]/[100] is suppressed at the central portion to increase the junction strength at the time of joining the wedge and to stabilize the breaking shape of the wires. Namely, it was found that homogeneously controlling the wire structure is not enough and, rather, it is important to positively utilize the difference in the structure between the central portion of the wire and the outer peripheral portion.

The absolute value $|1-Rc/Rs|\times100(\%)$ of a differential ratio between Rc and Rs which are the area ratios [111]/[100] at the central portion and at the outer peripheral portion is set to be not smaller than 30%. This is because, when this value is smaller than 30%, either the strength or the junction property can be improved to some extent but it is difficult to simultaneously improve them. Further, though there is no particular limitation, the upper limit in the differential ratio is smaller than 90% from the standpoint of effecting production maintaining stability and ease.

More desirably, the differential ratio between Rc and Rs is not smaller than 40%. This is because when the differential ratio is not smaller than 40%, the wedges can be joined more favorably onto the electrodes on a soft material such as the substrate and the tape. More desirably, when the differential ratio is not smaller than 50%, the wedge junction can be highly improved at a temperature lower than 160° C. enhancing the adaptability to the newest form of connection such as BGA, CSP, etc.

When the absolute value of the above differential ratio $(1-Rc/Rs)\times100(\%)$ is in the above range, favorable characteristics are obtained. Depending upon the positive or negative sign of the value, further, a slight difference is recognized in some uses. When $(1-Rc/Rs)\times100(\%)<-30\%$, Rc is relatively high at the central portion and is more advantageous for the junction of very fine wires at low temperatures. When $(1-Rc/Rs)\times100(\%)>30\%$, on the other hand, Rs is high at the peripheral portion and an increased effect is obtained for suppressing the flow of resin.

As for the boundary dividing the regions of the wire, if a region up to R/3 which is one-third the radius R from the center of the wire is regarded to be a core portion, a region from the surface up to 2R/3 on the outer side thereof is regarded to be the surface layer portion, and the area ratios [111]/[100] in the core portion and in the surface layer portion are denoted by Rd and Rf, then, it is desired that the absolute value $|1-Rd/Rf|\times100(\%)$ of the differential ratio between them is not smaller than 30%. This is because, by regarding the portion up to 2R/3 from the surface to be the surface layer portion and the remainder R/3 to be the core portion, the portion corresponding to the above-mentioned outer peripheral portion becomes thick to exhibit a further enhanced effect for suppressing the flow of wires.

In the crystal orientation in the lengthwise direction of the bonding wire in cross section in the lengthwise direction of the wire, the wire is divided into the central portion and the outer peripheral portion with the radius/2 of the wire as a boundary. Here, if the absolute value $|1-Rc/Rs|\times100(\%)$ of the differential ratio between area ratio Rc [111]/[100] of the central portion and the area ratio Rs [111]/[100] in the outer peripheral portion is not smaller than 30%, and the area ratio Ra [111]/[100] averaged on the whole cross section of the wire in the lengthwise direction is not smaller than 1.0, then, the strength is increased and the junction is enhanced at the same time. In particular, the linearity of the wires is improved and the effect is further enhanced for suppressing the wire sweep making it possible to cope with a narrow-pitch connection using very fine wires.

This utilizes the effect for enhancing the flexural rigidity and yield strength by increasing the ratio of the orientation [111] rather than the orientation [100] concerning the crystal orientation on the whole cross section of the wire in addition to controlling the structures divided into the central portion of the wire and the outer peripheral portion thereof.

It is possible to form regular loops by using bonding wires relying upon an overall process inclusive of complex loop loci, clamp opening/closing for holding the wires and delivery of wire based on the tension of the air stream. It therefore becomes necessary to control the elastic deformation and plastic deformation of the wires. Even after complex loops are formed, the linearity of the wires can be stably and effectively maintained by increasing the average area ratio Ra [111]/[100] over the whole cross section of the wire and by enhancing the flexural rigidity and yield strength. With the flexural rigidity and yield strength being increased, the wire sweep can be decreased in case the resin flows at a high speed at the time of molding and a large load is exerted on the wires because the elastic deformation and plastic deformation of the wires have been suppressed.

The average area ratio Ra [111]/[100] is set to be not smaller than 1.0 on the whole cross section of the wire. This is because, if Ra is smaller than 1.0, the flexural rigidity and the yield strength cannot be increased simultaneously. If Ra is not smaller than 1.0, the modulus of elasticity and flexural rigidity are increased. Even by using wires having a diameter of not larger than 18 μm, the linearity of the wires can be improved, the wire sweep decreases, and the adaptability is further enhanced to the connection maintaining a pitch as narrow as 40 μm or smaller. It is further desired that Ra is not smaller than 1.2. This is because, if Ra is not smaller than 1.2, it becomes possible to confirm the linearity of the loops simultaneously with the controllability of curved portions and folded portions in complex loop shapes such as trapezoidal loops and stepped loops necessary for the narrow-pitch connection.

In the crystal orientation in the lengthwise direction of the bonding wire, in cross-section in the lengthwise direction of the wire, the portion up to R/3 from the center of the wire is regarded to be the core portion, and the area ratio Rd [111]/[100] in the core portion is set to be in a range of 0.1 to 0.8. In this case, the strength is increased and, at the same time, the wedge junction is enhanced. Besides, the fatigue properties are improved at the wedge junctions to enhance the reliability. Therefore, even by using fine wires of 20 μm or thinner and fine working capillaries, the wedge junction can be maintained to a sufficient degree and the mass productivity of narrow-pitch connection is enhanced. When a Pb-free solder, that is expected in the future, is used, further, it is possible to greatly decrease the occurrence of defects such as cracks and breakage in the wedge junction portions that accompanies an increase in the reflow temperature. Therefore, the bonding wires promote practical use of Pb-free solder and can be utilized for a semiconductor package technology to solve environmental problems.

As for the reliability during the use, such as fatigue resistance of the wedge junction portions which are greatly deformed to acquire a complex structure, nothing has so far been reported, as mentioned earlier, and the wire material factors for improving the reliability have not been clarified. As for the behavior which determines the reliability, the members such as silicon chips, metal frames, bonding wires and molding resin exhibit different coefficients of thermal expansion and moduli of elasticity through the steps of a temperature cycle consisting of reflowing, heat generation during the use and cooling. It is therefore presumed that the thermal distortion is concentrated in the wedge junction portions resulting in the breakage. To relax the stress in the greatly deformed wedge junction portions, it becomes necessary to improve the fatigue characteristics at these portions. Therefore, the present inventors have paid attention, for the first time, to controlling the structure to improve the reliability of the wedge junction portions.

That is, the area ratio Rd [111]/[100] in the wire core portion is decreased and the ratio of the orientation [100] as compared to the orientation [111] is increased in order to improve fatigue characteristics at the junction portions. Further, the area ratio Rs [111]/[100] in the outer peripheral portion is set to be higher than the area ratio Rc at the central portion, by more than 30%, in order to increase the strength and the wedge junction property to a sufficient degree and to totally enhance the reliability in the narrow-pitch junction. In the extension of the conventional design of materials, it can be expected to slightly improve the fatigue characteristics by increasing the elongation at high temperatures, which is one of the wire properties accompanied, however, by a decrease in the wire strength. Therefore, it is difficult to control the loops of fine wires and, besides, the wire sweep increases making it difficult to cope with the narrow-pitch connection. On the other hand, suitable utilization of a profile of crystal grains having the orientation [100] at the core portion of the wire makes it possible to totally improve the properties accompanied by almost no harmful effect. Concerning the wire core region, the structure of the orientation [100] is utilized in a region, from the center up to R/3 (called core portion), which is deeper than the central portion of from the center of the wire up to R/2, in order to further enhance the effect for improving the reliability in the wedge junction portions without impairing the strength.

In the core portion, the area ratio Rd [111]/[100] is set to lie in a range of 0.1 to 0.8. This is because, if Rd is smaller than 0.1, it becomes difficult to maintain the strength of fine wires not thicker than 15 μm. If Rd exceeds 0.8, on the other hand, the effect for enhancing the fatigue characteristics decreases in the wedge junction portions.

In properly adjusting the parameters Rc, Rs, Rd and Ra, further, a differential ratio |1−Rc/Rs|×100(%) between the area ratios Rc and Rs in the central portion and in the outer peripheral portion is set to be not smaller than 30%, the ratio Rd in the core portion is set to lie in a range of 0.1 to 0.8, and the area ratio Ra [111]/[100] is set to be not smaller than 1.0 on the whole cross section of the wire. There were confirmed an increase in the strength, an improvement in the wedge junction, a decrease in the wire sweep owing to an increased flexural rigidity and an increased yield strength, and an increase in the tensile strength near the wedge junction portions due to a short span of not larger than 1 mm, which was a composite action, as expected from the control of the structure.

In the narrow-pitch connection using the BGA substrate or the tape, loops of wires of different lengths are in many cases formed in a package. When there is a difference in the height between the chip surface and the wedge junction surface and, besides, when the span is short, the angle of insertion between the wire and the junction surface becomes relatively great near the wedge junction portion, giving rise to the occurrence of cracks in the wedge junction portions when the samples are being transported or, when a pulling-test is conducted, causing the wedge junction portions to be broken though it does not usually occur. Therefore, the parameters Rc, Rs, Rd and Ra are controlled over the above-mentioned ranges to relatively easily expand the operation margin in joining the wedges maintaining a short span.

In the bonding wire having an area ratio Rs [111]/[100] of not smaller than 1.2 in the outer peripheral portion, it is possible to increase the strength and to improve the wedge junction at the same time, and to further improve the leaning. Next, described below are the effects on the leaning.

The leaning of wire at the erected portion near the ball junction becomes a problem in the connection maintaining a pitch of as narrow as 50 μm or smaller. While the linearity described above represents the average straight line of the loops as a whole, the leaning corresponds to the straight line in a local region near a portion just over the ball junction. Concretely speaking, the curve and folding represent the severest regions near the ball junctions where the gap is the smallest among the neighboring wires. Suppressing the leaning of wires at these portions is one of the important assignments in the step of narrow-pitch connection in mass production.

To suppress the leaning, it becomes necessary to prevent the fall in the transverse direction despite receiving a considerable degree of deformation or distortion due to the curve or folding near the ball junctions. The conventional method based on the mechanical characteristics only is not enough for suppressing the leaning. Controlling the average crystal orientation in the cross section of the wire is not enough, either, for satisfying the requirement for the leaning. It was found that controlling the profile of crystal orientations on the cross section of the wire is effective in suppressing the leaning.

Namely, the leaning is effectively improved if a difference between the area ratios Rc and Rs [111]/[100] in the central portion and in the outer peripheral portion of the wire is not smaller than 30% in terms of an absolute value, and if the area ratio Rs [111]/[100] in the outer peripheral portion is increased to be not smaller than 1.2. It is considered that the local curving and folding become relatively easy in forming the loops owing to the effect of relatively decreasing the area ratio [111]/[100] at the central portion, and that the leaning is suppressed owing to the effect of preventing the fall in a portion just on the ball by increasing the area ratio [111]/[100] in the outer peripheral portion. The portion just on the ball is where the recrystallization takes place due to the heat when the ball is melted and where the strength is generally most lowered. To reform this portion, the area ratio [111]/[100] is increased in the outer peripheral portion of the wire to decrease a drop in the strength caused by the heat; i.e., this is considered to be one of the factors contributing to suppressing leaning.

Here, the area ratio Rs [111]/[100] in the outer peripheral portion is set to be not smaller than 1.2. This is because if Rs is smaller than 1.2, the effect is not sufficient for improving the leaning. More desirably, RS is not smaller than 1.5. This is because the problem of leaning occurs frequently if the loop height is increased in the narrow-pitch connection. Upon setting Rs to be not smaller than 1.5, however, the leaning is suppressed to a sufficient degree even when the loop height exceeds 300 μm.

Further, the wire bending at the time of inverse step bonding, which so far was difficult to overcome, can be decreased to promote the multi-layer chip connection in the mass production if a difference between the area ratios Rc and Rs [111]/[100] in the central portion and in the outer peripheral portion of the wire is not smaller than 30% in terms of an absolute value, if the area ratio Rs [111]/[100] in the outer peripheral portion is increased to be not smaller than 1.2 and if the ratio Rd at the core portion which is on the inside of R/3 is adjusted to lie in a range of 0.1 to 0.8.

In the inverse step bonding, the wedge junction portion is located at a position higher than the ball junction portion, the length of the wire-erecting portion near the ball junction is several times as long as that of an ordinary bonding, the plastically deformed portion has a special structure, and defects, such as the bending and fall of the wires, frequently occur. The cause of the defect resembles that of the above leaning. In the interior of the wire, in the outer peripheral portion thereof and in the surface layer thereof, therefore, the structure is so controlled as to satisfy a relationship between the orientation [100] and the orientation [111] as described above, to lower the bending and fall of the wire and to enhance the productivity of inverse step bonding.

In the narrow-pitch connection using fine wires, the wire surfaces are scarred or the interiors of the capillaries are clogged as the wires are ground by the inner walls of the capillaries. It was found that these problems can be improved by controlling the structure in the region of the most surface portion of the wires.

That is, in the crystal grain structure in the cross section of the bonding wire in the lengthwise direction thereof, if the radius of the wire is denoted by R and a portion from the surface of the wire up to R/5 is regarded to be the outermost portion, then, the area ratio Rt [111]/[100] is set to be not larger than 1.0 in the crystal orientations in the outermost portion in the lengthwise direction of the wire, in order to decrease the scar or grinding on the wire surfaces, to suppress the clogging of capillaries and to increase the number of times the capillaries can be used consecutively.

Here, the area ratio Rt [111]/[100] in the outermost portion of from the wire surface up to R/5 is set to be in a range of not larger than 1.0. This is because the friction and sliding property between the inner wall of the capillary and the wire surface are chiefly dominated by a region of from the wire surface up to R/5. If Rt in the region exceeds 1.0, the friction and sliding property are deteriorated, and it becomes difficult to obtain the effect enough for improving scars on the wire surfaces or clogging in the capillaries. More desirably, Rt is in a range of not larger than 0.8. This is because, if a difference in the size between the hole diameter of the capillary and the wire diameter becomes 4 μm or smaller, which is likely to be much used in the narrow-pitch connection, the occurrence of defects such as scars on the wire surfaces and clogging in the capillaries, increases. By selecting Rt to lie in a range of not larger than 0.8, the effect for improvement can be enhanced to suppress the occurrence of scars and clogging in the capillaries.

It is desired that the crystal orientations in the present invention include those having angular differences of not larger than 10° in the crystal orientations relative to the lengthwise direction of the wire. Usually, even if attention is given to a crystal orientation in a certain orientation, the individual crystals contain angular differences to some extent. Besides, there occurs an angular difference to some degree depending upon the preparation of samples and the testing method such as measuring the crystal orientation. Here, if the range of angular differences is not larger than 10°, characteristics in the crystal orientations are included, and the effects on the properties of the bonding wires are sufficiently utilized. If the angular difference in the crystal orientation exceeds 10°, however, it is probable that a difference, in the effect upon the wire properties, occurs.

To cope with the trend toward increasing the pins and decreasing the pitch described earlier, it has frequently been attempted to effect the wire connection having different wire lengths and different loop heights in a single IC accompanied by problems due to dispersion in the height of the loops. When, for example, the loop shapes remain stable at all times, the probability of contact among the wires can be decreased by alternately changing the height of the loops among the neighboring wires. With the presently employed wires, however, limitation is imposed on controlling the height of the loops maintaining precision. In the conventional mounting structure having wire lengths of as short as about 3 mm, the loop height was dominated by the portions affected by heat near the balls, and height of the loop can be controlled relatively easily. In a modern multi-pin narrow-pitch connection, on the other hand, the wire lengths are increasing to exceed 5 mm, the loop heights are lying over a wide range, and it becomes very important to decrease the dispersion in the height of the loops.

To lower the dispersion in the height of the loops, it was discovered that it is necessary to control the structure of the wires and, besides, the number of crystal grains per a unit area plays a large role in addition to controlling the crystal orientation such as the orientation [111] or the orientation [100] described above. Namely, it was confirmed that if the difference between the area ratios Rc and Rs [111]/[100] in the central portion of the wire and in the outer peripheral portion thereof is selected to be not smaller than 30% in absolute value and the number of crystal grains is from 0.04 to 4/$\mu m^2$ on the cross section perpendicular to the lengthwise direction of the bonding wire, the strength can be increased, dispersion in the loop height can be decreased even when the wire length exceeds 5 mm, and the loops can be favorably controlled. Here, a range is selected for the number of crystal grains. This is because if the number of crystal grains is smaller than 0.04/$\mu m^2$, the loop shapes tend to be dispersed when a difference in the orientation of crystal grains that are neighboring each other. Besides, it becomes difficult to homogeneously form crystal grains which are as fine as 4 or more grains/$\mu m^2$ over the whole wire through the ordinary step of producing the bonding wires.

In the foregoing were described the bonding wires of the invention set forth in (1) to (21) above. The aggregate structure of the bonding wire has not been known and has not been reported, either. Though aggregate structures of various metals have been known in the rolled materials and in the fine drawn wires, there is yet no uniform opinion concerning the metal working method, relationship between the components and the aggregate structure, and relationship between the aggregate structure and properties of the materials used. So far, the aggregate structure has been measured relying upon the X-ray diffraction or electron-ray diffraction using TEM, which, however, are not capable of measuring aggregate structures in metal wires which are as fine as about 25 $\mu$m in diameter and are relatively soft.

The analytical technology is being vigorously developed, and a very small region X-ray capable of squeezing into a very small area of measurement, an electron back scattering pattern (EBSP) lately developed and the like methods, are measuring means which are very effective in the measurement of aggregate structure of very small samples. Among them, the EBSP makes it possible to relatively easily measure even such fine wires as bonding wires for their aggregate structure on the polished cross section. For instance, FIG. 1 illustrates the measurement of a gold bonding wire of a diameter of 25 $\mu$m by the EBSP, and in which the crystal orientation is correctly measured. By utilizing the above latest analytical technology, it was confirmed, for the first time, that the crystal orientation of the individual fine crystal grains and the profile of crystal orientation on the whole cross section can be highly precisely measured maintaining good reproduceability concerning the fine structures of the bonding wires. Here, however, correct data are not necessarily obtained even if the surface of the wire or the polished cross section thereof is simply measured by EBSP or by X-rays. It should be noted that the orientation is analyzed maintaining a high precision only after many experimental conditions are properly set, such as preparing samples and operating the apparatus.

In the EBSP measurement, further, the orientations of individual crystal grains can be observed to find the areas of the crystal grains. When the X-ray diffraction is used, however, the volume ratio of crystal orientation can be found relying on the X-ray intensity in each of the crystal orientations. In the crystal orientation found by the X-ray diffraction measurement of a cross section in the lengthwise direction of the bonding wire or of a cross section perpendicular to the lengthwise direction, therefore, the volume ratio of the crystal grain having the orientation [111] to the crystal grain having the orientation [100] is not smaller than 1.2, making it possible to increase the intensity and the modulus of elasticity and to decrease the wire sweep at the time of being molded with the resin. As for the area ratios of crystal grains having the orientation [111] and the orientation [100] of the invention other than those described above, it was confirmed that similar notation can be made maintaining a relation of volume ratios of the individual crystal orientations found by the X-ray diffraction method.

When X-ray diffraction is used, the intensity of the X-ray reflects the area. That is, a ratio related to the areas of the crystal grains having the orientation [111] or the orientation [100] can be expressed by a ratio of X-ray intensities of the crystal orientations.

In the X-ray intensity measured in the lengthwise direction of the bonding wire, therefore, if the ratio of the X-ray intensity of the crystal grains having the orientation [111] to the X-ray intensity of the crystal grains having the orientation [100] is not smaller than 1.2, then, the strength can be increased, the modulus of elasticity can be enhanced, and the wire sweep can be decreased when being molded with the resin. As for the area ratios of the crystal grains having the orientation [111] and the orientation [100] of the invention other than those described above, the relationships thereof can be expressed by the ratios of X-ray intensities of the individual crystal orientations.

Next, described below are the methods (22) to (24) of producing the bonding wires of the invention set forth in (1) to (14), (20) and (21) described above.

Means for controlling the crystal orientation can be roughly divided into a technology for production and alloy-forming components as described below.

A method of producing a bonding wire from a cast material which is a starting material through a step of a combination of rolling, pre-heat treatment, secondary drawing and after-heat treatment, which are effected at least one time in this order, wherein it is desired that an area working ratio in the rolling is not smaller than 95%, a heating temperature (absolute temperature) in the pre-heat treatment is in a range of 20 to 70% with respect to the melting point of the cast material, an area working ratio in the secondary drawing is not smaller than 99.5%, and a heating temperature (absolute temperature) in the after-heat treatment is in a range of 20 to 70% with respect to the recrystallization temperature of the cast material. This method makes it possible to adjust the crystal grains having the orientation [111] and the orientation [100] in the lengthwise direction of the wire.

The rolling can be done by using a roll with a round groove or a roll with a square groove, or a swaging rolling can be effected. The wire can be partly drawn by using large dies. If the average diameters of the wire before and after the rolling are denoted by Df and Dg, the total working degree of rolling can be expressed by $\{1-(Dg/Df)^2\}\times 100(\%)$. Next, the drawing is effected chiefly by using drawing dies. The drawing machine is the one capable of drawing the wire at one time using a plurality of dies. If the average radii of the wire before and after the drawing are denoted by Rf and Rg, the total working degree of drawing can be expressed by $\{1-(Rg/Rf)^2\}\times 100(\%)$. It is desired that the inner wall of the dies has been treated with an ultra-hard metal or diamond to exhibit excellent stability. The heat-treating method is of the type in which the wire in a state of being wound is placed in the heating oven and is heated at one time or is of the continuously heat-treating type in which the wire is heated while being continuously moved in the heating furnace of a predetermined length.

Upon simultaneously satisfying the above three conditions related to the working degree of rolling, working degree of drawing and heating temperature in the heat treatment, it is possible to easily enhance the orientation in the orientation [111] and the orientation [100]. When any one of the conditions is not satisfied, it becomes difficult to control the structure. When, for example, the total working degree of rolling is smaller than 95% or when the total working degree of drawing is smaller than 99.5%, the aggregated structure that is worked does not fully grow, and it becomes difficult to increase the area ratio [111]/[100] in the final aggregate structure in which the recovery/recrystallization are partly effected by the subsequent heating. When the heating temperature (absolute temperature) in the heat treatment is as low as less than 20% of the melting point of the starting material, it becomes difficult to orient the crystal orientations [111] and [100] in the subsequent step of drawing. When the heating temperature is as high as more than 70% thereof, it becomes difficult to maintain the area ratio [111]/[100] to be not smaller than 1.2 since the ratio of orientations other than the orientation [111] becomes high despite the wire is drawn up to the final wire diameter.

Further, the heating temperature in the subsequent heat treatment is set to lie in a temperature range of 20 to 70% of the recrystallizaton temperature of the starting material. This is because when the heating temperature is as low as less than 20% of the recrystallization temperature, there occurs a problem of wire bending due to the residence of working distortion in addition to the lack of orientation of crystals of [111]. When the heating temperature becomes so high as to exceed 70% thereof, on the other hand, the wire surfaces are oxidized to a conspicuous degree and the wedge junction is deteriorated. Here, the melting point is used as a reference of temperature in the pre-heat treatment since it has a strong relationship to the melting point. In the after-heat treatment, on the other hand, the recrystallization temperature is used. This is because the temperature in the after-heat treatment must be adjusted to obtain the same structure in the material having a different working degree of drawing in the final step. As the working degree is indirectly reflected in the recrystallization temperature, it becomes easy to control the orientation by determining the temperature range on the basis of the recrystallization temperature. Though there are several methods for determining the recrystallization temperature, there can be used, as the recrystallization temperature, the vicinity of a temperature at which the elongation after fracture suddenly increases in a relationship between the temperature at the elongation after fracture.

The heating is divided into two steps of pre-heat treatment and after-heat treatment to effectively orient the crystal orientations [111] and [100]. The pre-heat treatment has a role of imparting a predetermined directivity to the amorphous crystal orientation formed through the rolling, enabling the aggregate structure obtained by the subsequent drawing to develop directivity. Further, the after-heat treatment partly induces recovery/recrystallization making it possible to simultaneously control the crystal grains having the orientation [111] and the orientation [100].

In order to control the structure, further, the present invention provides a method of producing a bonding wire from a cast material through a step of a combination of rolling, primary drawing, pre-heat treatment, secondary drawing and after-heat treatment, which are effected at least one time in this order, wherein it is desired that an area working ratio in the rolling is not smaller than 95%, a heating temperature (absolute temperature) in the pre-heat treatment is in a range of 20 to 70% of the melting point (absolute temperature) of the cast material, an area working ratio in the secondary drawing is not smaller than 99.5%, an average drawing rate is 50 to 1000 m/min, a vessel temperature for drawing the wire is 5 to 45° C., a heating temperature (absolute temperature) in the after-heat treatment is in a range of 20 to 70% of the recrystallization temperature of the cast material, and a sweep tension is in a range of 0.2 to 70 mN. According to this method, it is possible to simultaneously control the crystal grains having the orientation [111] and the orientation [100] in the lengthwise direction of the wire and to control the profile of orientations on the cross section.

Upon controlling the profile of crystal orientations on the cross section of the wire, it is possible to effectively control the drawing rate, drawing temperature and sweep tension during the heat treatment because controlling the working ratio and heat treatment temperature only is not enough. Concretely speaking, within the above-mentioned ranges of the working ratio and heat treatment temperature, the average drawing rate is set to be 50 to 1000 m/min, the vessel temperature for drawing the wire is set to be 5 to 45° C., and the sweep tension in the after-heat treatment is set to be in a range of 0.2 to 70 mN, making it easy to increase the homogeneity in the crystal orientation on the whole cross section and to adjust the orientation of the structure in the surface layer portion. By adjusting the working ratio, heat treatment temperature, drawing rate, drawing temperature and sweep tension within suitable ranges, it becomes possible to highly precisely control the structure profile not locally but over a long range in the lengthwise direction of the wire on the whole cross section of the wire. Though it is difficult to individually specify these parameter conditions, described below are some conditions.

The average drawing rate is set to be 50 to 1000 m/min. This is because when the average drawing rate is smaller than 50 m/min, dispersion occurs in the lengthwise direction and mass produceability drops. When the average drawing rate exceeds 1000 m/min, on the other hand, it is probable that the dynamic recrystallization occurs due to the heat generated at the time of drawing the wire making it difficult to maintain homogeneity in the crystal orientation. When the vessel temperature for drawing the wire is lower than 5° C., it is probable that the wire surfaces are cooled. When the vessel temperature exceeds 45° C., on the other hand, the recovery proceeds in the outermost region of the wire inducing dispersion in the structure, increasing burden on the workers and, hence, inducing operation failures. When the sweep tension in the after-heat treatment is smaller than 0.2 mN, it is probable that the wire may flutter as it moves in the furnace developing dispersion in the heat-treated state. When the sweep tension in the after-heat treatment exceeds 70 mN, it is probable that the diameter of the wire may vary as it becomes fine.

From the standpoint of enhancing the structure controllability, it is desired that the step is carried out at a total working degree of rolling of not smaller than 95%, a total working degree of drawing of not smaller than 99.5%, at a heating temperature (absolute temperature) in the pre-heat treatment in a range of 30 to 70% of the melting point of the starting material and at a heating temperature in the after-heat treatment in a range of 30 to 70% of the recrystallization temperature of the starting material. Through this method, the degree of integration is further increased in the orientation [111] and in the orientation [100].

From the standpoint of controlling the structure, further, it is desired to add a step of finely drawing the wire or a combination of the step of finely drawing the wire and a step of a third heat treatment after the steps of rolling, pre-heat treatment, drawing of wire and after-heat treatment. The step of finely drawing the wire is added from the standpoint of increasing the strength by rendering the crystal grains to become fine near the wire surfaces and by locally increasing the dislocation. The step of finely drawing the wire and the step of the third heat treatment are added in combination from the standpoint of further increasing the sliding property and suppressing the wire sweep by rendering the crystal grains having the orientation [111] and the orientation [100] in the wire to become finer in the outer peripheral portion of the wire than those in the central portion thereof while utilizing the effect of the strength that is increased by reforming the surfaces.

More preferably, among a plurality of dies used for the drawing, not less than 30% of the dies have an area reduction ratio of not smaller than 10% to increase the homogeneity in the crystal orientation on the whole cross section and to decrease the difference in the area ratio [111]/[100] between the central portion and the outer peripheral portion. This is because the dies that have heretofore been used for drawing the bonding wire has an area reduction ratio of usually not larger than 6%, and it is considered that increasing the area reducing ratio to not smaller than 10% enhances the effect of homogeneously treating not only the surface layer portion but also the internal portion of the wire. Since not less than 30% of the dies used for the drawing have an area reduction ratio of not smaller than 10%, the structure is controlled even in drawing the wire at high speeds on a mass production level.

Further, among a plurality of dies used for the drawing, not less than 30% of the dies have an area reduction ratio of not smaller than 10% to control the structure. In this case, not only the homogeneity is enhanced in the crystal orientation on the whole cross section but also the above-mentioned area ratio [111]/[100] is effectively enhanced. The wire thus produced by being drawn is suppressed from the wire sweeping, achieves increased linearity in the shape of the loop and is less leaned at the ball-erecting portions owing to the increased strength and increased modulus of elasticity, and enhances the practicabiliy for the narrow-pitch connection.

To control the profile of several kinds of crystal orientations in the wire and to control the diameters of crystal grains, it is desired to select proper area reduction ratios of the individual dies, order of the dies, angle of inserting the wire into the dies and tension at the time of drawing. For instance, when the angle for inserting the wire in the dies is maintained constant or when the tension is adjusted at the time of drawing, the structure is made uniform on the whole cross section of the wire or the orientation is controlled in the surface layer portion not locally but over a large range (several tens of meters to several millions of meters) in the lengthwise direction of the wire to produce a homogeneous bonding wire. As for the arrangement of dies, for example, the dies having the area reduction ratio of not smaller than 10% is used in a step close to the final wire diameter, or the rate for narrowing the wire diameter is slightly delayed in a range where the drawing rate is 40 to 400 m/sec in order to control the structure in the central portion of the wire or in the surface layer portion thereof.

In addition to controlling the structure relying chiefly upon the production method, elements added into the wire are effectively utilized to further suppress the leaning which in recent years has become a problem in accomplishing a narrow pitch.

A gold alloy bonding wire is obtained by using, as a chief component, Au which has now been chiefly used as a modern wire material, adding one or more elements selected from Y, Ca, Yb and Eu at a total concentration $C_1$ of 0.002 to 0.03% by mass, and adding one or more elements selected from La, Tb, Dy and Nd at a total concentration $C_2$ of 0.002 to 0.05% by mass, the components that are added maintaining a relationship of concentrations in a range of $0.1<C_1/C_2<10$. In addition to assisting the formation of the crystal grains having the orientation [111], therefore, it is possible to further suppress the leaning. The leaning is suppressed by the wire production method described above. Upon adding the above-mentioned elements, further, the structure is controlled in the portions affected by the heat near the ball portions to further suppress the leaning. Here, if $C_1$ is smaller than 0.002% by mass or if $C_2$ is smaller than 0.002% by mass, the effect is small for controlling the structure. On the other hand, if $C_1$ exceeds 0.03% by mass or if $C_2$ exceeds 0.05% by mass, the strength drops at the ball junction portions on the Al alloy pads. If $0.1<C_1/C_2<10$, then, a synergistic effect of two kinds of element groups can be expected making it relatively easy to control the degree of integration of the orientation [111] and to totally improve use performance such as the stability of loops and the junction.

More preferably, the above-mentioned production method is combined with the wire material in which the above two kinds of element groups have a concentration relationship of $0.4<C_1/C_2<6$ to further promote the effect for controlling the crystal orientations and to make it easy to set the orientation of crystal orientations [111] and [100] within the range of the invention.

Described below are the methods (25) to (27) of producing the bonding wires (15) to (21) of the invention.

Means for controlling the crystal orientation can be roughly divided into production technology and alloy-forming components as will be described below.

To control the structure of the gold bonding wire, the present invention provides a method of producing a bonding wire from a cast material through a step of a combination of rolling, primary drawing, pre-heat treatment, secondary drawing and after-heat treatment, which are effected at least one time in this order, wherein area working ratios in the rolling and in the primary drawing are not smaller than 95%, a heating temperature (absolute temperature) in the pre-heat treatment is in a range of 30 to 70% of the melting point (absolute temperature) of the cast material, an area working ratio in the secondary drawing is not smaller than 99.5%, an average drawing rate is 100 to 800 m/min, a difference in the tension before and after the dies is in a range of 0.1 to 50 MPa, a heating temperature (absolute temperature) in the after-heat treatment is in a range of 30 to 70% of the recrystallization temperature (absolute temperature) of the cast material, and drawing angles at the dies outlets in the primary drawing and in the secondary drawing are not larger than 30°. Within ranges of these conditions, it is allowed to adjust to obtain crystal grains having the orientation [111] and the orientation [100] in the lengthwise direction of the wire specified by the invention.

The rolling can be done by using a roll with a round groove or a roll with a square groove, or a swaging rolling can be effected. The wire can be partly drawn by using a large dies. If the average diameters of the wires before and after the rolling are denoted by Df and Dg, the area working ratio of rolling can be expressed by $\{1-(Dg/Df)^2\}\times100(\%)$. Next, the drawing is effected chiefly by using drawing dies. The drawing machine is the one capable of drawing the wire at one time using a plurality of dies. If the average radii of the wire before and after the drawing are denoted by Rf and Rg, the area working ratio can be expressed by $\{1-(Rg/Rf)^2\}\times100(\%)$. It is desired that the inner wall of the dies has been treated with an ultra-hard metal or diamond to exhibit excellent stability.

The heat-treating method is of the type in which the wire in a state of being wound is placed in the heating oven and is heated at one time or is of the continuously heat-treating type in which the wire is heated while being continuously moved in the heating furnace of a predetermined length.

The above conditions must be suitably selected for the area working ratio of rolling, area working ratio of drawing and heating temperature in the heat treatment. The reasons for selecting the conditions are because if the area working ratios are smaller than 95% in the rolling and in the primary drawing or if the area working ratio is smaller than 99.5% in the secondary drawing, the aggregate structure being worked grows insufficiently, and it becomes difficult to adjust the area ratio [111]/[100] in the final aggregate structure in which the recovery/recrystallization is partly produced through the subsequent heating. Further, if the heating temperature in the heat treatment is less than 30% of the melting point of the starting material, it becomes difficult to orient the crystal orientations [111] and [100] in the subsequent step of drawing. If the heating temperature exceeds 70%, on the other hand, orientations other than [111] occupy an increased proportion despite the wire being drawn to the final diameter, and it becomes difficult to control the area ratio [111]/[100].

The average drawing rate is set to be 100 to 800 m/min. This is because if the average drawing rate is smaller than 100 m/min, dispersion occurs in the lengthwise direction and the mass productivity drops. If the average drawing rate exceeds 800 m/min, on the other hand, it is probable that the dynamic recrystallization takes place due to heat that is generated when the wire is stretched making it difficult to maintain homogeneity in the crystal orientations. The difference in the tension before and after the dies is set to be 0.1 to 50 MPa. This is to utilize the effect for controlling the working distortion near the wire surface by controlling the difference in the tension before and after the dies. If the difference is smaller than 0.1 MPa, dispersion easily occurs in the structure in the lengthwise direction of the wire. If the difference exceeds 50 MPa, a problem arises concerning the breakage of fine wires. Further, if the drawing angle at the dies outlets in the primary drawing and in the secondary drawing are not larger than 30°, the working strain is locally controlled on the cross section perpendicular to the lengthwise direction of the wires, and the structure is easily controlled in the wire and in the outer peripheral portion thereof.

To promote a difference in the area ratio [111]/[100] near the center of the wire and near the surface layer, it becomes necessary to positively control a combination of the working and the recovery/recrystallization basically within the range of the above-mentioned conditions. For example, it is desired to employ a method of imparting a change to the working degree or to the working strain near the center and near the surface layer in the rolling, in the primary drawing and in the secondary drawing or to employ a method of varying the recovery/recrystallazation in the direction of depth from the wire surface during the heating such as the pre-heat treatment and the after-heat treatment. By combining the two, further, it is possible to introduce the working strain more near the surface layer of the wire than in the interior thereof in the steps of rolling and drawing by using dies, while utilizing the dynamic recrystallization based on an increase in the working rate to relax the working strain in the surface layer portion. It is further possible to produce a change in the temperature in the direction of depth of the wire by changing the temperature, moving speed and tension during the heat treatment. The aggregate structure is affected by the synergistic effect of the working and recovery/recrystallication. By suitably utilizing the working conditions and the heat treatment conditions in combination, it is possible to vary the area ratio [111]/[100] in the internal direction of the wire.

In the step of gradually narrowing the diameter, the conditions may not necessarily be set the same, and a difference can be produced in the profile of crystal orientations near the center and near the surface layer by changing conditions, such as the sweep angles, depending upon the wire diameter. The area reduction ratio, drawing rate and heat treatment temperature in the die working can be relatively easily varied and controlled, and the effects can be easily obtained. Among the plurality of dies used for drawing the wire, there are used three kinds of dies groups having area reduction ratios of smaller than 7%, 7 to 11%, and 11 to 20% each in an amount of at least not less than 10% to relatively easily control the crystal orientations separately near the center and near the surface layer. By changing the combinations of the number of dies of the above three kinds of dies groups and their order, it is possible to finely adjust the ratio of crystal orientations in a range of the wire structure specified by the invention.

Further, the wire is continuously swept and is heat-treated by using a heating furnace having such a temperature profile that a heating temperature Te (absolute temperature) at both ends of the heating furnace is lower than a heating temperature Tm (absolute temperature) at the central portion by 0.02 Tm to 0.3 Tm, to impart a change in the behavior of recrystallization near the center and near the surface layer thereby to control the crystal orientations in the direction of depth of the wire. It becomes further possible to control the crystal orientations near the wire surfaces by using a heating furnace which generates a gas stream in a predetermined portion only and by continuously sweeping and heat-treating the wire in the furnace.

The structure according to the invention can be obtained relatively easily if the bonding wire is made of a wire material comprising Au as a chief component. Desirably, by taking into consideration the operability in the step of producing the wire and the oxidation during the formation of balls at the time of use, it is desired that the bonding wire contains Au as a chief component, contains one or more elements selected from Be, Ca, La, In, Gd, Nd, Ce, Dy, Tb and Y at a total concentration $C_3$ of 0.0005 to 0.02% by mass, or contains one or more elements selected from Ag, Sn, Pd, Pt and Cu at a total concentration $C_4$ of 0.003 to 0.1% by mass. More desirably, if the total concentration $C_3$ of the above element group is 0.005 to 0.015% by mass, it becomes easier to constitute the structure of the invention facilitating the control of production.

EXAMPLES

Example I

The bonding wires (1) to (14), (20) and (21) of the invention and the production methods (22) to (24) thereof will now be described by way of Examples.

By using electrolytic gold having a gold purity of not lower than about 99.995% by mass and by adding necessary components, the gold alloys having chemical components shown in Tables 1 to 5 were melted in a melting furnace and cast, the ingots thereof were rolled, pre-heat-treated in a heating furnace, drawn by using dies, and were after-heat-treated by continuously sweeping and heating the wires to thereby produce the bonding wires. The final wire diameter was selected to be, chiefly, not larger than 20 μm.

The steps of production will now be concretely described. First, an ingot of a diameter of 6 to 30 mm was prepared. In the step of rolling, the ingot was rolled by using a thin roll at a rate of 30 to 200 m/min until the wire diameter was 0.5 to 1.5 mm.

In the step of pre-heat treatment, the wire was held in an oven heating furnace set at 250 to 800° C. for 0.1 to 2 hours, and was left to cool in the open air outside the furnace. In the step of drawing, the wire was drawn at a rate in a range of 80 to 400 m/sec at a vessel temperature for drawing of 20 to 35° C. by using a continuous drawing device capable of setting a plurality of dies and by using the dies coated with diamond. The inner walls of the dies were cleaned by being washed by ultrasonic cleaning prior to being used. The area reduction ratio of the dies that were used was divided into two kinds, i.e., a low area reduction ratio of 5 to 8%, and a high area reduction ratio of 12 to 15%. The number of the high area reduction dies occupied 35 to 80% of the all the dies. In the step of after-heat treatment, an infrared heating furnace was used having a homogeneously heating zone of 20 cm. The wire was continuously moved and heat-treated through the furnace set at 250 to 700° C. at a rate of 50 to 800 m/min with a sweep tension in a range of 2 to 60 mN, such that the elongation in the tension testing was 3 to 5%. Table 3 illustrates concrete production methods of Examples shown in Table 2.

To connect the bonding wires, there was used a general-purpose automatic wire bonding device to effect the ball/wedge junction. In the ball junction, a ball was formed at an end of the wire by an arc discharge, and the ball was joined to an electrode film by thermal press-adhesion also utilizing ultrasonic waves. Further, the other end of the wire was wedge-joined to a lead frame or to a lead portion of a BGA substrate. A narrow-pitch connection was effected maintaining a gap among the electrodes of 50 μm to examine the adaptability to the narrow-pitch connection which is expected to be required in the future.

The counterpart to be joined was an electrode film on the silicon substrate, i.e., an Al alloy film (Al-1% Si, Al-0.5% Cu, Al-1% Si-0.5% cu) having a thickness of about 0.8 μm, or a Cu wiring (Au 0.01 μm/Ni 0.4 μm/Cu 0.4 μm). As the counterpart for the wedge junction, there was used a lead frame of which the surface has been plated with Ag (thickness: 1 to 4 μm) or a glass epoxy substrate of which the surface has been plated with Au/Ni/Cu wiring.

The strength and the modulus of elasticity which are the representative mechanical properties of the wires were measured relying on the tension testing. The sample length was 10 mm, the number of the samples were 5, and average values were found.

As for the wire structure, a wire polished in cross section in the lengthwise direction was etched and was checked for a number of crystal grains as observed by using a SEM. Further, a region of the sample polished on cross section in the same manner was measured for its crystal orientations by the EBSP method. The area ratio of crystal grains of the orientation [111] or the orientation [100] was found on the whole cross section of the wire. A portion from the center of the wire having a radius R up to a portion R/2 from the center was regarded to be the central portion, and a portion from the surface of the wire up to a portion of a depth R/3 was regarded to be the surface layer portion. In this case, the area ratios of crystal grains of the orientation [111] in the central portion and in the surface layer portion were found on the cross section in the lengthwise direction of the wire.

To evaluate the linearity of the bonded loops, a hundred wires bonded while maintaining a gap (span) of 6 mm were observed from the upper side by using a projector. Deviations of portions where the wires were most separated were measured as bending amounts relative to the lines connecting the junction portions on the ball side and on the wedge side. The average bending amount smaller than a wire diameter was judged to be favorable and was denoted by ⊚, the average bending amount not smaller than two wire diameters was judged to be defective and was denoted by Δ, and the average bending amount lying in between was judged to cause no problem and was denoted by ○.

As for the stability of loop shape (loop controllability) in the step of bonding, the height of loop was measured at three places for each wire, and a standard deviation of the height of loops was evaluated. The number of samples was 50, and an optical microscope was used for the measurement. The three measuring portions included a portion just on the ball, the highest portion that could be reached and a central portion in the wire length where dispersion in the height of loops tended to occur. When the standard deviation in the height of loop was not smaller than one-half the wire diameter, it was so judged that the dispersion was great. When the standard deviation was smaller than one-half thereof, it was so judged that the dispersion was small and favorable. On the basis of this judgement, when the dispersion was small at three places, it was so judged that the loop shape was stable and was denoted by ⊚. When there was one place where the dispersion was great, it was so judged that the loop shape was relatively good and was denoted by ○. When there were two places where the dispersion was great, the loop shape was denoted by Δ and when the dispersion was great on three places, the loop shape was denoted by X. The wires were evaluated for those having a length of 4 mm (shape 1) which are being increasingly used in BGA and the like and for those having a length of 6 mm (shape 2) which is a long span with which it is more difficult to obtain a loop shape maintaining stability.

In the narrow-pitch connection, it is a tendency to connect the loops of different heights in the same chip accompanied by a problem of maintaining the linearity and suppressing the dispersion in the shape of the loops. In order to more severely evaluate the stability in the shape of the loops, the high and low loops were evaluated. Low loops of a number of 50 having a maximum height of not higher than 100 μm and high loops of a number of 50 having a maximum height of not lower than 300 μm were bonded. The two kinds of loops having different heights were measured for their linearity. When the average bending amount was smaller than a wire diameter, these two kinds of loops were judged to be favorable and were denoted by ⊚. When the average bending amount of the one kind of the loops was not smaller than the wire diameter, no problem was usually caused and the loops were denoted by ○. When the average bending amount of the two kinds of loops were not smaller than the wire diameter, improvement was necessary and the loops were denoted by Δ. When the average bending amount of the one kind of the loops was not smaller than two wire diameters, the loops were defective and were denoted by X.

To evaluate two kinds of the loops having different heights for their stability in the loop shape (loop controllability), the heights of the loops were measured at two places including the highest portion that could be reached and the central portion in the wire length. The loops were judged to be greatly dispersing when the standard deviation in the height of the loops was not smaller than one-half the wire diameter. Among the standard deviations of the height of loops measured at four places, i.e., two places in each of the two kinds of loops of different heights, the loop shape was judged to be stable and was denoted by ⊚ when the dispersion was small at four places, the loop shape was judged to be relatively good and was denoted by ○ when the dispersion was great at one place, and the loop shape was denoted by Δ when the dispersion was great at two or more places.

To evaluate the wedge junction, the counterpart for being joined was a resin substrate on which the surface had been plated Au/Ni/Cu wiring. The stage on which the sample was mounted was maintained at a temperature as low as 175° C. at which the wedge junction became more severe. Ten 200-pin chips were used as a reference for evaluation and a total of 2000 wires were connected. When the continuous bonding operation was interrupted even once due to defective wedge junction or when defects such as peeling were recognized at two or more places as observed by using an optical microscope, it was judged to be caused by insufficient wedge junction and the wedge junction was denoted by Δ. When there was no problem in the continuous bonding and no defect was observed, it was judged that the wedge junction was good and was denoted by ⊚. When the continuous bonding was accomplished but when the peeling was observed at one place, which was in between the above two cases, no problem was caused and, hence, the wedge junction was denoted by ○.

After the wires were bonded onto the resin substrate under the above wedge junction conditions, the occurrence of defective wire folding was examined. The phenomenon in which the wire is locally folded due to plastic deformation can be distinguished from the ordinary defect of wire bending in which the wire as a whole is deformed. Two thousand wires were connected while maintaining a span of 3 mm. When the number of the defective folding was 0, the wire folding was judged to be very good and was denoted by ⊚. When the number of the defective foldings was 2, it was judged that there was no problem in practice and the wire holding was denoted by ○. When the number of the defective foldings was in a range of 2 to 4, some improvement was necessary and, hence, the wire folding was denoted by Δ.

As for the leaning which is a phenomenon in which the wire-erecting portion falls near the ball junction which is a problem arising in recent years, the wire-erecting portion was observed from the horizontal direction of the chip, and a maximum gap was evaluated between a perpendicular passing through the center of the ball junction portion and the wire-erecting portion. The wire length was 4 mm, and the number of the samples were 30. When the gap was smaller than the wire diameter, the leaning was judged to be favorable. When the gap was larger than the wire diameter, the erecting portion was tilted and the leaning was judged to be defective. The frequency of defective leanings was classified. The defect occurring at three or more places was denoted by Δ, the defect occurring at no place was denoted by ⊚, and the defect in between was denoted by ○.

As for the sliding property of the bonding wire, no uniform evaluation method has been established in this field of art. This time, the wire was moved in the capillary at a predetermined speed and at a predetermined angle, and the drawing strength at this moment was measured and the surface state of the tested wire was observed through a SEM. When the drawing strength was small and no scars were found on the surfaces of the wire, the sliding property was judged to be good and was denoted by ⊚. When the drawing strength was great or when the scars were recognized even to a slight degree on the surfaces of the wire, the sliding property was denoted by ○.

As for the measurement of the wire sweep when being molded with the resin, a lead frame mounting the semiconductor element to which the wires have been bonded while maintaining a span of about 4 mm was molded with an epoxy resin by using a molding device. Then, the interior of the semiconductor element molded with the resin was projected with X-rays by using a soft X-ray non-destructive inspection device, and the sweeping amount of a portion where the wire sweep is a maximum was measured for 30 samples, and a value (percentage) obtained by dividing an average value thereof by the spanning length of the wire was defined as a wire sweep after the molding.

As for the dispersion in the wire sweep after molded, the wire sweep was judged to be stable and was denoted by ⊚ when the standard deviation was within 0.8% of the wire sweep found as described above, the wire sweep was judged to practically free from any problem and was denoted by ○ when the standard deviation was in a range of 0.8 to 2%, and the wire sweep was judged to involve problem in practice and was denoted by Δ when the standard deviation was not smaller than 2%.

As for the conditions for evaluating the yield at the time of producing the wire, a good productivity can be maintained and the yield was denoted by ⊚ when the number of times of wire breakage per a kilogram of ingot was smaller than 0.5 times while drawing the wire to assume a diameter of 18 μm and when the standard deviation of the fracture strength of 30 samples was suppressed to be smaller than 4.9 mN. The yield was denoted by ○ when either the condition of the number of times of wire breakage or the condition of dispersion in the fracture strength was not satisfied, and the yield was denoted by Δ when the number of times of wire breakage per a kilogram of ingot was 0.5 times or more and when the standard deviation of the fracture strength of 30 samples was not smaller than 4.9 mN as the productivity had to be further improved.

Table 1 illustrates a relationship between the wire structures and the use performance of bonding wires. Tables 2 and 3 illustrate relationships among the components added to the bonding wires comprising chiefly Au, the production methods and the wire structures. The results of evaluation of the bonding wires according to the invention were listed as Examples, and the results deviating from the constitution of the invention were listed as Comparative Examples.

In Table 1, the bonding wires related to the invention (1) are Examples 1 to 15, the bonding wires related to the invention (2) are Examples 1 to 6, 9, 10 and 12 to 15, the bonding wires related to the invention (3) are Examples 1 to 8 and 12 to 15, the bonding wires related to the invention (10) are Examples 3 to 6, 8, 9, 11, 12 and 15, and the bonding wires related to the invention (21) are Examples 1 to 12. Comparative Examples in Table 1 are those in which the structural constitutions of the bonding wires of the invention (1) are not satisfied.

Tables 2 and 3 illustrate the elements added to the bonding wires comprising chiefly Au, the production methods and the structures. Examples 16 to 31 are the wires produced by the production method satisfying any one of those described in (22) to (24) of the invention, and satisfying the structural constitution of the bonding wires of the invention (1). Among them, Examples 16 to 27 are the Au alloy bonding wires having the component constitution of the invention (14), and Examples 28 to 31 are those without satisfying the component constitution of the invention (14) but are utilizing the production method of the invention. On the other hand, Comparative Examples 5 to 9 are those without satisfying the production methods described in (22) to (24) of the invention and without satisfying, either, the structural constitution of the bonding wires of the invention (1).

In Tables 4 and 5, the bonding wires related to the invention (4) are Examples 32 to 34, the bonding wires related to the invention (5) are Examples 34 and 35, the bonding wires related to the invention (6) are Examples 35 to 37, the bonding wires related to the invention (7) are Examples 36 and 37, and the bonding wires related to the invention (13) are Examples 32, 24, 26 and 37.

In Tables 6 and 7, the bonding wires related to the invention (8) are Examples 42 to 49, the bonding wires related to the invention (9) are Examples 43 to 49 and 51, and the bonding wires related to the invention (11) are Examples 42 and 44 to 49.

TABLE 1

| | | Ratio of crystal orientations | | | | | | |
|---|---|---|---|---|---|---|---|---|
| | | Whole wire | | Surface layer | Difference [111]/[100] between center and cross | Number of | wire | |
| | | Area ratio [111]/[100] | Ratio of [111] (%) | Area ratio [111]/[100] | section on ave. (absolute value) | crystal grains per μm² | Material | Wire diameter (μm) | Electrode material |
| Example | 1 | 1.2 | 53 | 1.4 | 0.20 | 0.05 | Au | 25 | Al—Si |
| | 2 | 1.4 | 55 | 1.3 | 0.15 | 0.08 | Au | 20 | " |
| | 3 | 2.0 | 55 | 2.1 | 0.10 | 0.1 | Au | 18 | Al—Si—Cu |
| | 4 | 2.4 | 68 | 2.7 | 0.10 | 0.1 | Au alloy 4 | 20 | Al—Cu |
| | 5 | 5.2 | 80 | 5.5 | 0.08 | 0.2 | Au alloy 5 | 20 | " |
| | 6 | 10.0 | 85 | 10.2 | 0.05 | 1 | Au alloy 4 | 20 | Al—Si—Cu |
| | 7 | 1.4 | 47 | 1.5 | 0.10 | 0.5 | Au alloy 6 | 20 | Cu |
| | 8 | 2.1 | 40 | 2.2 | 0.15 | 0.1 | Au | 20 | Al—Cu |
| | 9 | 1.5 | 55 | 2 | 0.35 | 1 | Au alloy 1 | 20 | " |
| | 10 | 1.8 | 60 | 1.5 | 0.35 | 3 | Au alloy 2 | 20 | Al—Si |
| | 11 | 2.0 | 48 | 2.4 | 0.36 | 0.1 | Au alloy 3 | 20 | " |
| | 12 | 1.5 | 47 | 1.2 | 0.34 | 0.1 | Au | 20 | Al—Si |
| | 13 | 1.8 | 60 | 2 | 0.20 | 0.02 | Au alloy 1 | 20 | " |
| | 14 | 1.5 | 55 | 1.4 | 0.10 | 0.02 | Au | 20 | Cu |
| | 15 | 3.5 | 65 | 3.8 | 0.15 | 5 | Au alloy 2 | 20 | Al—Si—Cu |
| Comparative Example | 1 | 1.1 | 40 | 1.2 | 0.15 | 0.05 | Au | 20 | Al—Si |
| | 2 | 1.1 | 52 | 1.3 | 0.10 | 0.08 | Au | 20 | " |
| | 3 | 1.0 | 30 | 1.1 | 0.10 | 0.1 | Au | 20 | Al—Si—Cu |
| | 4 | 0.9 | 40 | 0.8 | 0.15 | 0.05 | Au | 20 | Al—Cu |

| | | | | | Loop controllability | | | | |
|---|---|---|---|---|---|---|---|---|---|
| | | Tensile strength (MPa) | Modulus of elasticity (GPa) | Linearity (6 mm long) | Shape 1 (4 mm long) | Shape 2 (6 mm long) | Leaning | Wire sweep (%) | Sliding |
| Example | 1 | 320 | 90 | ◎ | ◎ | ◎ | ◎ | 3.8 | ○ |
| | 2 | 326 | 90 | ◎ | ◎ | ◎ | ◎ | 3.4 | ○ |
| | 3 | 330 | 91 | ◎ | ◎ | ◎ | ◎ | 3.3 | ◎ |
| | 4 | 342 | 92 | ◎ | ◎ | ◎ | ◎ | 2.5 | ◎ |
| | 5 | 372 | 95 | ◎ | ◎ | ◎ | ◎ | 2.4 | ◎ |
| | 6 | 378 | 102 | ◎ | ◎ | ◎ | ◎ | 2.2 | ◎ |
| | 7 | 311 | 91 | ○ | ◎ | ○ | ◎ | 3.6 | ○ |
| | 8 | 317 | 92 | ○ | ◎ | ○ | ◎ | 3.2 | ◎ |
| | 9 | 321 | 92 | ◎ | ○ | ◎ | ○ | 3.7 | ◎ |
| | 10 | 352 | 93 | ◎ | ◎ | ◎ | ○ | 3.2 | ○ |
| | 11 | 341 | 96 | ○ | ◎ | ○ | ○ | 3.0 | ◎ |
| | 12 | 332 | 92 | ○ | ◎ | ○ | ○ | 3.7 | ○ |
| | 13 | 343 | 92 | ◎ | ◎ | ○ | ◎ | 3.2 | ◎ |
| | 14 | 327 | 92 | ◎ | ◎ | ○ | ◎ | 3.5 | ○ |
| | 15 | 354 | 96 | ◎ | ◎ | ○ | ◎ | 2.7 | ◎ |
| Comparative Example | 1 | 253 | 73 | Δ | Δ | X | Δ | 5.4 | ○ |
| | 2 | 272 | 78 | Δ | Δ | X | Δ | 5.1 | ○ |
| | 3 | 256 | 76 | Δ | Δ | X | Δ | 5.7 | ○ |
| | 4 | 235 | 72 | Δ | Δ | X | Δ | 6.3 | ○ |

TABLE 2

| | | Wire components (mass %) | | | | | | | | | | | |
|---|---|---|---|---|---|---|---|---|---|---|---|---|---|
| | | C1 | | | | | C2 | | | | Sum1/ | | Material |
| | | Y | Ca | Yb | Eu | Sum1 | La | Tb | Dy | Nd | Sum2 | Sum2 | Au | name |
| Example | 16 | 0.001 | | | 0.001 | 0.002 | 0.001 | | | 0.001 | 0.002 | 1.0 | remainder | |
| | 17 | | 0.002 | | 0.001 | 0.003 | | 0.002 | 0.002 | | 0.004 | 0.8 | remainder | |
| | 18 | | | 0.001 | 0.002 | 0.003 | 0.002 | | 0.002 | 0.002 | 0.006 | 0.5 | remainder | Au alloy 1 |
| | 19 | 0.003 | 0.004 | | 0.003 | 0.01 | | 0.005 | | 0.005 | 0.010 | 1.0 | remainder | Au alloy 2 |
| | 20 | 0.005 | | 0.005 | | 0.01 | 0.002 | | 0.002 | | 0.004 | 2.5 | remainder | |
| | 21 | | 0.005 | | 0.01 | 0.015 | | 0.01 | | 0.01 | 0.020 | 0.8 | remainder | |
| | 22 | 0.005 | | 0.01 | | 0.015 | 0.01 | | 0.01 | | 0.020 | 0.8 | remainder | |
| | 23 | | 0.005 | | 0.01 | 0.015 | | 0.01 | | 0.01 | 0.020 | 0.8 | remainder | Au alloy 3 |
| | 24 | 0.005 | | 0.01 | | 0.015 | 0.01 | | 0.01 | | 0.020 | 0.8 | remainder | |
| | 25 | 0.005 | 0.005 | 0.005 | 0.005 | 0.02 | 0.01 | 0.005 | 0.005 | 0.005 | 0.025 | 0.8 | remainder | Au alloy 4 |
| | 26 | | 0.001 | 0.001 | 0.001 | 0.003 | 0.01 | | | 0.001 | 0.020 | 0.2 | remainder | Au alloy 5 |
| | 27 | 0.01 | 0.006 | | 0.01 | 0.026 | 0.001 | 0.001 | 0.001 | | 0.003 | 8.7 | remainder | Au alloy 6 |
| | 28 | 0.0005 | | 0.0005 | | 0.001 | 0.001 | | 0.001 | 0.001 | 0.003 | 0.3 | remainder | |
| | 29 | 0.001 | 0.001 | | 0.001 | 0.003 | | 0.0005 | | 0.0005 | 0.001 | 3.0 | remainder | |
| | 30 | 0.0005 | | | 0.001 | 0.0015 | 0.008 | 0.001 | | 0.01 | 0.028 | 0.05 | remainder | |
| | 31 | 0.08 | | 0.1 | 0.08 | 0.26 | 0.008 | | 0.008 | 0.006 | 0.022 | 11.8 | remainder | |
| Comparative | 5 | | 0.0005 | | 0.0005 | 0.001 | 0.0005 | 0.0005 | 0.0005 | | 0.0015 | 0.7 | remainder | |
| Example | 6 | | 0.005 | | 0.01 | 0.015 | | 0.01 | | 0.01 | 0.020 | 0.8 | remainder | |
| | 7 | 0.05 | | 0.01 | | 0.015 | 0.01 | | 0.01 | | 0.020 | 0.8 | remainder | |
| | 8 | | 0.005 | | 0.01 | 0.015 | | 0.01 | | 0.01 | 0.020 | 0.8 | remainder | |
| | 9 | 0.005 | | 0.01 | | 0.015 | 0.01 | | 0.01 | | 0.020 | 0.8 | remainder | |

TABLE 3

| | | Production method | | | | | | Ratio of crystal orientations | | | Difference [111]/[100] between | |
|---|---|---|---|---|---|---|---|---|---|---|---|---|
| | | Rolling degree (%) | Ratio of pre-heat treating temp. relative to m.p. | Drawing degree (%) | Drawing rate (m/min) | Temp. of drawing vessel (° C.) | Ratio of high reduction dies (%) | Ratio of after-heat treating temp. relative to recrystallization (%) | Whole Wire Area ratio [111]/[100] | Whole Wire Ratio of [111] (%) | Surface layer Area ratio [111]/[100] | center and cross section on ave. (absolute value) | Number of crystal grains per μm² |
| Example | 16 | 98 | 35 | 99.5 | 200 | 25 | 40 | 45 | 1.2 | 52 | 1.4 | 0.10 | 0.05 |
| | 17 | 99 | 50 | 99.5 | 200 | 25 | 40 | 45 | 1.5 | 55 | 1.6 | 0.15 | 0.1 |
| | 18 | 99.9 | 40 | 99.5 | 100 | 25 | 60 | 35 | 1.5 | 55 | 2 | 0.35 | 1 |
| | 19 | 99 | 40 | 99.5 | 200 | 25 | 40 | 45 | 1.8 | 55 | 1.8 | 0.35 | 3 |
| | 20 | 98 | 70 | 99.5 | 300 | 25 | 40 | 75 | 1.5 | 55 | 1.4 | 0.05 | 0.9 |
| | 21 | 98 | 50 | 99.5 | 500 | 8 | 34 | 45 | 4.0 | 70 | 4.5 | 0.20 | 0.5 |
| | 22 | 98 | 50 | 99.995 | 300 | 20 | 40 | 70 | 1.4 | 55 | 1.5 | 0.15 | 0.02 |
| | 23 | 98 | 40 | 99.8 | 200 | 30 | 50 | 38 | 1.9 | 48 | 2.4 | 0.36 | 0.1 |
| | 24 | 98 | 35 | 99.9 | 200 | 43 | 40 | 75 | 1.5 | 62 | 1.7 | 0.20 | 3 |
| | 25 | 99 | 60 | 99.5 | 100 | 25 | 40 | 45 | 2.5 | 68 | 2.7 | 0.10 | 0.1 |
| | 26 | 99.5 | 50 | 99.95 | 400 | 25 | 40 | 35 | 5.2 | 80 | 5.5 | 0.08 | 0.2 |
| | 27 | 98 | 55 | 99.5 | 300 | 20 | 40 | 48 | 1.4 | 47 | 1.5 | 0.10 | 0.5 |
| | 28 | 98 | 40 | 99 | 70 | 25 | 5 | 35 | 1.8 | 60 | 1.7 | 0.15 | 0.7 |
| | 29 | 98 | 50 | 99.5 | 600 | 23 | 40 | 50 | 2.5 | 55 | 2.7 | 0.15 | 5 |
| | 30 | 98 | 60 | 99.5 | 200 | 25 | 10 | 45 | 1.5 | 55 | 1.8 | 0.34 | 0.1 |
| | 31 | 98 | 55 | 99.5 | 200 | 25 | 10 | 60 | 1.4 | 55 | 1.2 | 0.20 | 0.05 |
| Comparative | 5 | 80 | — | 97 | 100 | 25 | 20 | 70 | 1.1 | 40 | 1.2 | 0.05 | 0.05 |
| ative | 6 | 99 | 10 | 97 | 40 | 25 | 20 | 52 | 1.1 | 32 | 1.4 | 0.35 | 2 |
| Example | 7 | 98 | 50 | 99 | 1200 | 2 | 10 | 60 | 1.0 | 38 | 1.1 | 0.15 | 0.03 |
| | 8 | 98 | 90 | 90 | 300 | 25 | 15 | 83 | 0.9 | 40 | 0.8 | 0.20 | 0.05 |
| | 9 | 98 | 50 | 99.5 | 200 | 25 | 10 | 85 | 0.9 | 45 | 1 | 0.20 | 0.05 |

TABLE 4

| | | Whole wire | | Surface layer | Difference [111]/[100] between center and cross section | Layer A where ratio [111]/[100] is different | | | | Number of crystal grains | Wire | Wire |
|---|---|---|---|---|---|---|---|---|---|---|---|---|
| | | Area ratio [111]/[100] | Ratio of [111] (%) | Area ratio [111]/[100] | on ave. (absolute value) | Ratio [111]/[100] | Ratio of layer width to radius | Ratio of [111] in layer A | Ratio of [100] in layer A | per μm² | Material | diameter (μm) |
| Example | 32 | 1.2 | 45 | 1.4 | 0.20 | 1.68 | 0.3 | 42% | 25% | 0.1 | Au | 18 |
| | 33 | 1.4 | 42 | 1.3 | 0.15 | 1.97 | 0.2 | 63% | 32% | 0.2 | Au alloy 2 | 18 |
| | 34 | 2.0 | 60 | 2.1 | 0.10 | 8.00 | 0.3 | 80% | 10% | 0.1 | Au alloy 3 | 15 |
| | 35 | 1.3 | 40 | 2.7 | 0.10 | 0.86 | 0.3 | 30% | 35% | 0.2 | Au | 20 |
| | 36 | 1.4 | 50 | 5.5 | 0.08 | 0.48 | 0.2 | 25% | 52% | 0.2 | Au alloy 2 | 18 |
| | 37 | 1.4 | 52 | 10.2 | 0.05 | 0.29 | 0.2 | 20% | 70% | 0.3 | Au alloy 4 | 15 |
| | 38 | 1.3 | 38 | 1.2 | 0.34 | 1.33 | 0.15 | 40% | 30% | 0.1 | Au | 18 |
| | 39 | 1.4 | 50 | 2 | 0.20 | 0.95 | 0.2 | 38% | 40% | 0.2 | Au alloy 1 | 18 |
| | 40 | 1.3 | 55 | 1.4 | 0.10 | 3.75 | 0.05 | 75% | 20% | 0.3 | Au alloy 1 | 18 |
| | 41 | 1.4 | 48 | 3.8 | 0.15 | 0.75 | 0.05 | 30% | 40% | 0.5 | Au | 18 |

TABLE 5

| | | Electrode material | Tensile strength (MPa) | Modulus of elasticity (GPa) | Linearity (6 mm long) | Loop controllability Shape 1 (4 mm long) | Loop controllability Shape 2 (6 mm long) | Evaluation of high, low loops (loop height 100, 300 μm) Linearity | Evaluation of high, low loops Loop Controllability | Leaning | Wire sweep (%) | Sliding |
|---|---|---|---|---|---|---|---|---|---|---|---|---|
| Example | 32 | Al—Si | 320 | 95 | ◎ | ◎ | ◎ | ○ | Δ | ◎ | 2.8 | ○ |
| | 33 | " | 326 | 95 | ◎ | ◎ | ◎ | ◎ | Δ | ◎ | 3.3 | ○ |
| | 34 | Al—Si—Cu | 330 | 105 | ◎ | ◎ | ◎ | ◎ | Δ | ◎ | 2.5 | ○ |
| | 35 | Al—Si | 342 | 92 | ◎ | ◎ | ◎ | Δ | ○ | ◎ | 3.7 | ○ |
| | 36 | " | 320 | 95 | ◎ | ◎ | ◎ | Δ | ◎ | ◎ | 2.8 | ○ |
| | 37 | Al—Si—Cu | 378 | 102 | ◎ | ◎ | ◎ | Δ | ◎ | ◎ | 2.8 | ○ |
| | 38 | Al—Si | 332 | 92 | ◎ | ◎ | ◎ | Δ | Δ | ◎ | 3.7 | ○ |
| | 39 | " | 343 | 92 | ◎ | ◎ | ◎ | Δ | Δ | ◎ | 3.4 | ○ |
| | 40 | Cu | 327 | 92 | ◎ | ◎ | ◎ | Δ | Δ | ◎ | 3.5 | ○ |
| | 41 | Al—Si—Cu | 354 | 96 | ◎ | ◎ | ◎ | Δ | Δ | ◎ | 3.6 | ○ |

TABLE 6

| | | Area ratio of total of orientations [111] and [100] (%) | | | Whole wire | | Surface layer | Difference [111]/[100] between center and cross section | Layer A where ratio [111]/[100] is different | | | | Number of crystal grains |
|---|---|---|---|---|---|---|---|---|---|---|---|---|---|
| | | Pm in whole wire | Pc at the center (R/2) | Ps in the surface (R/3) | Area ratio [111]/[100] | Ratio of [111] (%) | Area ratio [111]/[100] | on ave. (absolute value) | Ratio [111]/[100] | Ratio of layer width to radius | Ratio of [111] in layer A | Ratio of [100] in layer A | per μm² |
| Example | 42 | 52% | 53% | 52% | 1.5 | 48 | 2 | 0.15 | — | — | — | — | 0.1 |
| | 43 | 52% | 65% | 47% | 1.8 | 45 | 1.8 | 0.15 | 2.17 | 0.13 | 65% | 30% | 0.1 |
| | 44 | 62% | 63% | 62% | 1.2 | 52 | 1.4 | 0.20 | 1.68 | 0.15 | 42% | 25% | 0.05 |
| | 45 | 67% | 72% | 67% | 1.4 | 55 | 1.3 | 0.15 | 2.03 | 0.22 | 65% | 32% | 0.08 |
| | 46 | 71% | 85% | 65% | 1.8 | 68 | 5.5 | 0.08 | 0.48 | 0.2 | 25% | 52% | 1 |
| | 47 | 73% | 64% | 74% | 2.4 | 62 | 2.7 | 0.10 | — | — | — | — | 0.1 |
| | 48 | 81% | 68% | 85% | 4.8 | 57 | 4.8 | 0.10 | — | — | — | — | 0.2 |
| | 49 | 91% | 95% | 90% | 5.2 | 80 | 5.5 | 0.08 | — | — | — | — | 0.2 |
| | 50 | 44% | 45% | 43% | 2.1 | 40 | 2.2 | 0.15 | 1.68 | 0.13 | 42% | 25% | 0.1 |
| | 51 | 46% | 62% | 40% | 2.1 | 40 | 2.2 | 0.15 | — | — | — | — | 0.1 |

TABLE 7

| | | Wire | | | | Loop | | | | | | Dispersion in | | Yield of wire |
| --- | --- | --- | --- | --- | --- | --- | --- | --- | --- | --- | --- | --- | --- | --- |
| | | Wire | | Modulus | | controllability | | | | | | | | |
| | Material | Wire diameter (μm) | Electrode material | Tensile strength (MPa) | of elasticity (GPa) | Linearity (6 mm long) | Shape 1 (4 mm long) | Shape 2 (6 mm long) | Wedge junction | Wire folding | Leaning | Wire sweep (%) | the wire sweep | Sliding | production |
| Example 42 | Au | 18 | Al—Cu | 317 | 92 | ○ | ◎ | ○ | ◎ | ◎ | ◎ | 3.2 | ◎ | ○ | ○ |
| 43 | Au | 18 | Al—Cu | 317 | 92 | ○ | ◎ | ○ | ◎ | ◎ | ◎ | 3.2 | ○ | ◎ | ◎ |
| 44 | Au alloy 2 | 20 | Al—Si | 320 | 90 | ○ | ◎ | ◎ | ◎ | ◎ | ◎ | 3.8 | ◎ | ◎ | ◎ |
| 45 | Au alloy 1 | 18 | " | 326 | 90 | ◎ | ◎ | ◎ | ◎ | ◎ | ◎ | 3.4 | ◎ | ◎ | ◎ |
| 46 | Au alloy 1 | 18 | " | 321 | 92 | ◎ | ○ | ◎ | ◎ | ◎ | ○ | 3.7 | ◎ | ○ | ◎ |
| 47 | Au alloy 4 | 18 | Al—Cu | 342 | 92 | ◎ | ◎ | ◎ | ◎ | ◎ | ◎ | 2.5 | ◎ | ○ | ◎ |
| 48 | Au alloy 5 | 18 | " | 358 | 93 | ◎ | ◎ | ◎ | ◎ | ◎ | ◎ | 2.4 | ◎ | ○ | ◎ |
| 49 | Au alloy 5 | 15 | " | 370 | 95 | ◎ | ◎ | ◎ | ◎ | ◎ | ◎ | 2.7 | ◎ | ○ | ◎ |
| 50 | Au | 20 | Al—Cu | 317 | 92 | ○ | ◎ | ○ | ○ | ○ | ◎ | 3.2 | ○ | ◎ | ○ |
| 51 | Au | 18 | Al—Cu | 317 | 92 | ○ | ◎ | ○ | ○ | ○ | ◎ | 3.2 | ○ | ○ | ◎ |

The bonding wires of Examples 1 to 15 possessed area ratios [111]/[100] of the invention of not smaller than 1.2, and featured large strengths and high moduli of elasticity of not lower than 300 MPa and 90 MPa, respectively, and wire sweeps that were suppressed to be smaller than 4.0%. Among them, in Examples 2 and 3 in which the area ratios were in a range of 1.4 to 2.5, the wire sweeps were suppressed to be smaller than 3.5%. In Examples 4 to 6 in which the area ratios were not smaller than 2.5, the wire sweeps were improved to be smaller than 2.5%. In Comparative Examples 1 to 4, on the other hand, the bonding wires possessed area ratios [111]/[100] of smaller than 1.2, exhibiting strengths of 270 MPa or smaller and moduli of elasticity of lower than 80 MPa. As a result, the wire sweeps were as high as 5% or more.

The bonding wires of Examples 1 to 6, 9 and 10 were satisfying the area ratios of crystal grains having the orientation [111] of the invention (2) of not smaller than 55%, and exhibited large strengths, high moduli of elasticity as well as improved linearity in the loop shape and improved wedge junction at low temperatures. Such improvements were not recognized from Examples 7, 8, 11, 12 without satisfying the structural constitution of the invention (2) or from Comparative Examples 1 to 4.

For the bonding wires of Examples 1 to 8 and 13 to 15, the absolute value |1−Rc/Ra|×100(%) of the differential ratio of the area ratio Rc [111]/[100] at the center of the wire and the area ratio Ra [111]/[100] on the whole cross section on average related to the invention (3) was smaller than 30%, and the structure possessed a ratio Ra of not smaller than 1.2 on the whole cross section of the wire. As for the bonding performance, therefore, it was confirmed that the leaning of the ball-erecting portion was suppressed. The above improvement was not recognized from Examples 9 to 12 without satisfying the structural constitution of the invention (3) or from Comparative Examples 1 to 4.

For the bonding wires of Examples 3 to 6, 8, 9, 11 and 12, the area ratio [111]/[100] in the surface layer of the wire related to the invention (4) was not smaller than 1.6, and the area ratio [111]/[100] was not smaller than 1.2 on the whole sectional area of the wire. As for the bonding performance, therefore, the sliding property was improved, the loop control was facilitated, clogging in the capillaries was decreased and scars were decreased on the wire surfaces. The above improvements were not recognized from Examples 1, 2, 7, 10 and 12 without satisfying the structural constitution of the invention (4) or from Comparative Examples 1 to 4.

As for the loop controllability, the bonding wires of Examples 1 to 26 of the invention formed stable loops when the span was 4 mm, whereas the loop shapes were greatly dispersed in Comparative Examples 1 to 4. When compared on the basis of a long span of 6 mm, stable loop shapes were obtained in Examples 1 to 12 in which the numbers of crystal grains were from 0.04 to 4 per μm², and excellent loop controllability was obtained.

As for the effects of the components and the production method upon the structure, with reference to Table 2 related to the bonding wires of an Au alloy, the production conditions in any one of the inventions (22) to (24) were satisfied, and the area ratio [111]/[100] of not smaller than 1.2 was achieved in the desired structure. If compared, the differences were recognized in the structure or in the use performance between Examples 16 to 27 having component constitution according to the invention (14) and Examples 28 to 31 not satisfying the component constitution of the invention (14). In Examples 4 to 7 corresponding to use performance of bonding wires having component constitutions of Examples 25 to 27, excellent improvement was accomplished in suppressing the leaning. However, such an improvement was not recognized from Examples 9 to 11 in Table 1 which exhibited the use performance of bonding wires having the component constitutions of Examples 18, 19 and 23. Comparative Examples 5 to 9 were the cases of not satisfying the production conditions of the invention, and in which the area ratios [111]/[100] were smaller than 1.2.

For the bonding wires of Examples 32 to 34, the layer having the area ratio [111]/[100] of the invention of not smaller than 1.6 existed and maintained a width of not smaller than R/10 in the radial direction of the wire. Therefore, the low loops having a maximum loop height of not larger than 100 μm and the high loops having a maximum loop height of not smaller than 300 μm, exhibited good linearity as compared to Examples 35 to 41 not satisfying the above condition. In Examples 33 and 34 among them, the area ratio of [111] in the layer was not smaller than 60% and, hence, the linearity was further improved.

For the bonding wires of Examples 35 to 37, the layer having an area ratio [111]/[100] of the invention of smaller than 0.9 existed in a width of not smaller than R/10 but smaller than R/3 in the radial direction of the wire. Therefore, the low loops having a maximum loop height of not larger than 100 μm and the high loops having a maximum loop height of not smaller than 300 μm exhibited stable loop shapes as compared to Examples 32 to 34 and 38 to 41 not satisfying the above condition. In Examples 36 and 37, the area ratio of [100] in the layer was not smaller than 50% and, hence, the stability in the loop shape was further improved.

For the bonding wires of Examples 42 to 49, the area ratio of the total of the crystal grains of [111] and [100] of the invention was set to be not smaller than 50%. As compared to Examples 50 and 51 not satisfying the conditions, therefore, it was confirmed that the wedge junction was improved and, besides, the defective wire folding was decreased.

For the bonding wires of Examples 43 to 49 and 51, the area ratio of the total area of the crystal grains having orientations [111] and [100] occupying the central portion from the center of the wire up to R/2 of the invention was set to be not smaller than 60%. Compared to Examples 42 and 50 not satisfying the conditions, therefore, it was confirmed that the yield of the wire production was improved when the wire was drawn to a wire diameter of 18 μm.

For the bonding wires of Examples 42 and 44 to 49, the ratio of the total areas of the crystal grains having orientations [111] and [100] occupying the surface region of from the surface of the wire up to R/3 was set to be not smaller than 50%. Compared to Examples 43, 50 and 51 not satisfying the conditions, therefore, it was confirmed that a dispersion was suppressed in the wire sweep of when being molded with the resin.

In some samples, further, attention was given to principal crystal orientations that were observed in addition to the orientation [111] and orientation [100], and it was confirmed that the orientation [112] existed in large amounts in Examples 42 and 44, and the orientations [110] and [122] existed in large amounts in Example 43, from which it was confirmed that low loops having a long span of 4 mm and a loop height of not higher than 150 μm could be formed while maintaining stability.

The bonding wires according to the invention (10) were Examples 32 to 34, the bonding wire according to the invention (12) was Example 34, the bonding wires according to the invention (20) were Examples 35 to 37, and the bonding wires according to the invention (21) were Examples 36 and 37. Examples 38 and 40 satisfied the invention (1) but did not satisfy the structural constitution of the bonding wire of the invention (4). Examples 39 and 41 did not satisfy the structural constitution of the bonding wire of the invention (6).

Figure 2:
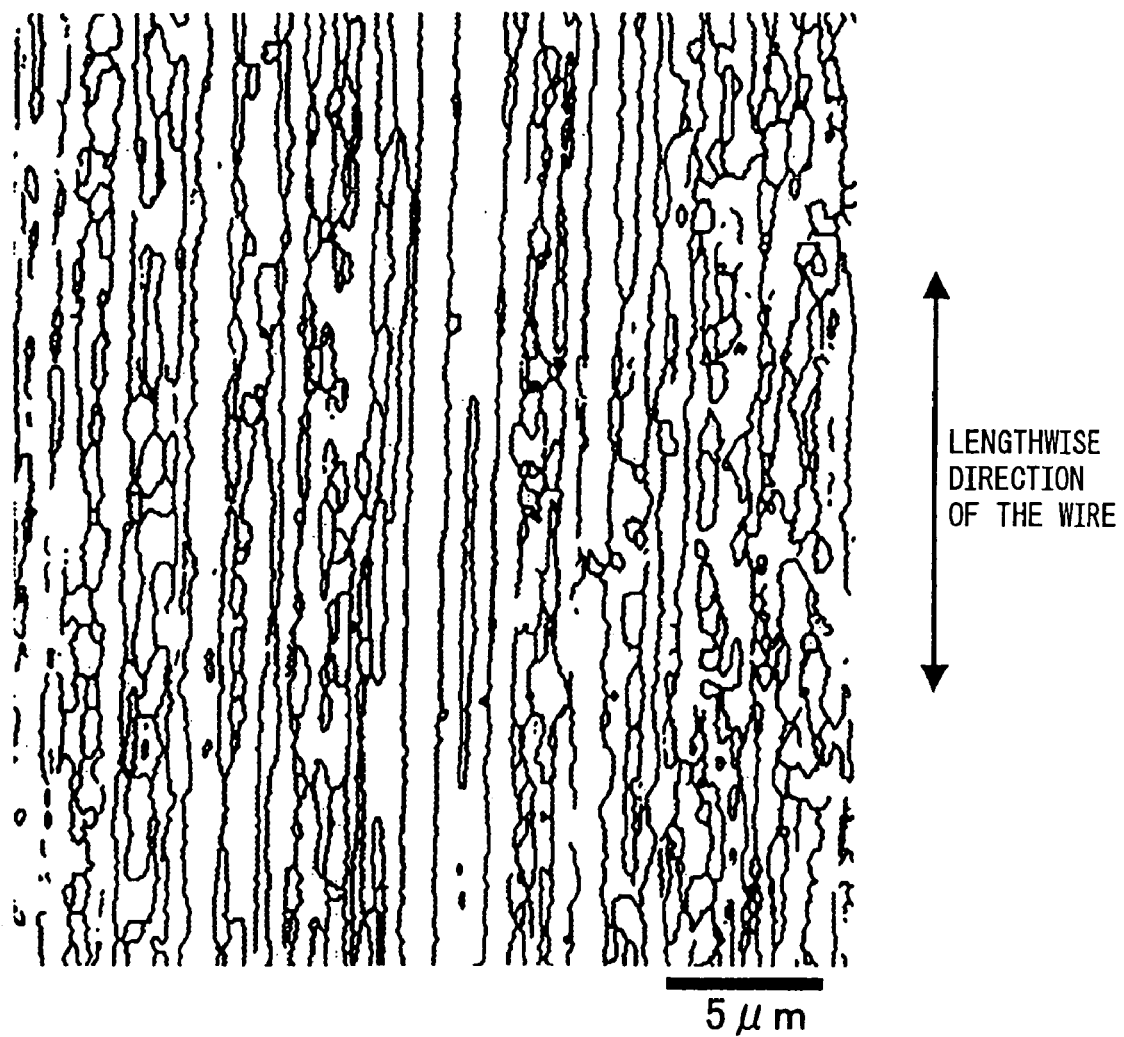
FIG. 2 is a view illustrating crystal grain boundaries of a gold bonding wire (wire diameter of 18 μm) as measured by EBSP.

For Examples 32, 34, 36 and 37, it was confirmed that the wire included two or more crystal grains in a length of not smaller than 70% of the wire diameter having crystal orientations oriented within an angle of not larger than 15° in the lengthwise direction of the wire. As compared to Examples 33, 35 and 38 to 42, the wire sweep had been suppressed to be smaller than 3%. FIG. 2 illustrates a result of EBSP measurement on the cross section of the gold bonding wire in Example 36, and shows crystal grain boundaries when there occurs an angular difference of not smaller than 15°. Two or more crystal grains were observed in the central portion of the wire with their crystal orientations being oriented within an angle of not larger than 15° in the lengthwise direction of the wire.

To increase the strength, the alloy elements must be added in increased amounts resulting, however, in an increase in the electric resistance of the material. In the wires comprising chiefly Au in Examples 1 to 19, an increase in the electric resistance relative to that of pure gold was suppressed to be not larger than 10% while achieving the strength of as large as 300 to 400 MPa. In the wires based on the conventional components, on the other hand, the elements had to be added at a high concentration (>1% by mass) to obtain a large strength of not smaller than 300 MPa. When an element such as Cu, Pd or Pt was added in an amount of not smaller than 1% by mass, however, the electric resistance inevitably increased by more than 30% relative to that of pure gold.

Example II

The bonding wires (15) to (21) of the invention and the production methods (25) to (27) thereof will be described by way of Examples.

By using electrolytic gold having a gold purity of not lower than about 99.995% by mass, the gold alloys containing one or more kinds of elements selected from Be, Ca, La, In, Gd, Nd, Ce, Dy, Tb and Y at a total concentration in a range of 0.0005 to 0.02% by mass or containing one or more kinds of elements selected from Ag, Sn, Pb, Pt and Cu at a total concentration in a range of 0.003 to 0.1% by mass were melted in a melting furnace and cast, the ingots thereof were rolled, pre-heat-treated in a heating furnace, stretched by using dies, and were after-heat-treated by continuously sweeping and heating the wires to thereby produce the bonding wires. The final wire diameter was selected to be 20 μm.

Tables 8 and 9 illustrate area ratios of crystal orientations of the wires and use performance of the wire bonding.

Table 10 illustrates the production conditions. In these Examples, the production conditions specified by the invention are satisfied while in Comparative Examples, at least one of the production conditions lies outside the range specified by the present invention.

TABLE 8

| | | Ratio of crystal orientations (area ratio R of [111]/[100]) | | | | | | | | | | |
|---|---|---|---|---|---|---|---|---|---|---|---|---|
| | | Relation between center Rc and outer periphery Rs (radius/2 as boundary) | | Whole wire | Relation between center Rd and outer periphery Rf (radius/3 as boundary) | | Area ratio Rt in most | Number of crystal | Wire diam- | | Wedge junction | | |
| | | |1 − Rc/Rs| | Rc in center | Rs in outer periphery | Area ratio Ra of [111]/[100] | Area ratio Rd in core (R/3) | |1 − Rd/Rf| | surface portion (R/5) | grains per μm² | eter (μm) | Electrode material | Metal frame 220° C. | On resin tape 180° C. | 160° C. |
| Example | 61 | 36% | 0.84 | 1.32 | 1.20 | 0.74 | 40% | 1.2 | 0.1 | 20 | Al—Si | ◎ | ○ | ◎ |
| | 62 | 45% | 0.66 | 1.20 | 1.07 | 0.56 | 47% | 1.2 | 0.08 | 20 | " | ◎ | ◎ | ○ |
| | 63 | 62% | 0.50 | 1.30 | 1.10 | 0.40 | 57% | 1.3 | 0.03 | 20 | Al—Si—Cu | ◎ | ◎ | ◎ |
| | 64 | 64% | 0.40 | 1.10 | 0.93 | 0.30 | 57% | 0.9 | 0.06 | 20 | " | ◎ | ◎ | ◎ |
| | 65 | 83% | 0.25 | 1.50 | 1.19 | 0.15 | 57% | 1.2 | 0.1 | 20 | Al—Cu | ◎ | ◎ | ◎ |
| | 66 | 75% | 0.40 | 1.60 | 1.30 | 0.35 | 80% | 1.2 | 0.05 | 20 | " | ◎ | ◎ | ◎ |

TABLE 8-continued

| | | Ratio of crystal orientations (area ratio R of [111]/[100]) | | | | | | | | | | | |
|---|---|---|---|---|---|---|---|---|---|---|---|---|---|
| | | Relation between center Rc and outer periphery Rs (radius/2 as boundary) | | | Whole wire | Relation between center Rd and outer periphery Rf (radius/3 as boundary) | | Area ratio Rt in most surface portion (R/5) | Number of crystal grains per μm² | Wire diam-eter (μm) | Electrode material | Wedge junction | | |
| | | |1 − Rc/Rs| | Rc in center | Rs in outer periphery | Area ratio Ra of [111]/[100] | Area ratio Rd in core (R/3) | |1 − Rd/Rf| | | | | | Metal frame 220° C. | On resin tape | |
| | | | | | | | | | | | | | | 180° C. | 160° C. |
| | 67 | 90% | 0.30 | 3.00 | 2.33 | 0.20 | 92% | 2.0 | 0.1 | 20 | " | ◎ | ◎ | ◎ |
| | 68 | 44% | 0.85 | 1.52 | 1.35 | 0.80 | 25% | 1.2 | 1 | 20 | Al—Si—Cu | ◎ | ◎ | ○ |
| | 69 | 31% | 0.90 | 1.30 | 1.20 | 0.85 | 20% | 1.3 | 0.5 | 20 | Cu | ◎ | ○ | ○ |
| | 70 | 75% | 0.30 | 1.22 | 0.99 | 0.20 | 35% | 1.2 | 1.5 | 20 | Al—Si | ◎ | ◎ | ◎ |
| | 71 | 34% | 0.67 | 1.02 | 0.93 | 0.57 | 34% | 0.7 | 4.3 | 20 | " | ◎ | ○ | ○ |
| | 72 | 43% | 0.70 | 1.22 | 1.09 | 0.60 | 40% | 1.2 | 0.1 | 20 | Al—Cu | ◎ | ◎ | ○ |
| | 73 | 31% | 0.80 | 1.16 | 1.07 | 0.70 | 35% | 1.2 | 1 | 20 | " | ◎ | ○ | ○ |
| | 74 | 37% | 1.3 | 0.95 | 1.04 | 1.20 | 36% | 1.1 | 0.1 | 20 | Al—Si | ◎ | ○ | ○ |
| | 75 | 41% | 1.2 | 0.85 | 0.94 | 1.10 | 42% | 0.7 | 0.4 | 20 | " | ◎ | ◎ | ◎ |
| | 76 | 75% | 1.4 | 0.80 | 0.95 | 1.30 | 70% | 0.5 | 4.2 | 20 | Al—Si | ◎ | ◎ | ◎ |
| Comp. Exam-ple | 11 | 18% | 0.90 | 1.10 | 1.05 | 0.80 | 25% | 1.1 | 0.1 | 20 | Al—Si | Δ | Δ | Δ |
| | 12 | 27% | 0.88 | 1.20 | 1.12 | 0.78 | 5% | 1.3 | 0.2 | 20 | " | Δ | Δ | Δ |
| | 13 | 27% | 1.10 | 1.50 | 1.40 | 1.00 | 30% | 1.3 | 0.03 | 20 | Al—Si—Cu | Δ | Δ | Δ |
| | 14 | 11% | 0.80 | 0.90 | 0.88 | 0.70 | 15% | 1.1 | 0.1 | 20 | Al—Si | Δ | Δ | Δ |
| | 15 | 22% | 1.10 | 0.90 | 0.95 | 1.00 | 25% | 0.7 | 1 | 20 | " | Δ | Δ | Δ |
| | 16 | 15% | 1.50 | 1.30 | 1.35 | 1.40 | 118% | 1.2 | 2 | 20 | Al—Cu | Δ | Δ | Δ |

TABLE 9

| | | Sphericity of small balls (1.4 times of wire diameter) | Wire sweep when molded with resin | Linearity of loops (6 mm long) | Hi-temp. reflow | Heat cycle testing | Short-span peeling | Leaning | | Bending of reverse bonding | Scars and grinding on wire surface | Clogging of narrow-pitch capillaries | Stability of loop shape (5 mm long) |
|---|---|---|---|---|---|---|---|---|---|---|---|---|---|
| | | | | | | | | Loop height, 200 μm | Loop height, 350 μm | | | | |
| Example | 61 | ◎ | ◎ | ◎ | ◎ | ◎ | ◎ | ◎ | ○ | ◎ | ○ | ○ | ◎ |
| | 62 | ◎ | ◎ | ○ | ◎ | ◎ | ◎ | ◎ | ○ | ◎ | ○ | ○ | ◎ |
| | 63 | ◎ | ◎ | ○ | ○ | ◎ | ◎ | ◎ | ○ | ○ | ○ | ○ | ◎ |
| | 64 | ◎ | ○ | ○ | ◎ | ◎ | ○ | ◎ | ○ | ◎ | ◎ | ◎ | ◎ |
| | 65 | ◎ | ◎ | ◎ | ◎ | ◎ | ◎ | ◎ | ◎ | ◎ | ○ | ○ | ◎ |
| | 66 | ◎ | ◎ | ◎ | ◎ | ◎ | ◎ | ◎ | ◎ | ◎ | ○ | ○ | ◎ |
| | 67 | ◎ | ◎ | ◎ | ◎ | ◎ | ◎ | ◎ | ◎ | ◎ | ○ | ○ | ◎ |
| | 68 | ◎ | ◎ | ◎ | ○ | ○ | ○ | ◎ | ◎ | ○ | ○ | ○ | ◎ |
| | 69 | ◎ | ◎ | ◎ | ○ | ○ | ○ | ◎ | ○ | ○ | ○ | ○ | ◎ |
| | 70 | ◎ | ○ | ○ | ○ | ◎ | ○ | ◎ | ○ | ◎ | ◎ | ◎ | ◎ |
| | 71 | ◎ | ◎ | ○ | ○ | ◎ | ○ | ○ | ○ | ○ | ◎ | ◎ | ○ |
| | 72 | ◎ | ◎ | ○ | ◎ | ◎ | ◎ | ◎ | ○ | ◎ | ○ | ○ | ◎ |
| | 73 | ◎ | ◎ | ○ | ◎ | ◎ | ◎ | ○ | ○ | ◎ | ○ | ○ | ◎ |
| | 74 | ◎ | ◎ | ○ | ○ | ○ | ○ | ◎ | ○ | ○ | ◎ | ◎ | ◎ |
| | 75 | ◎ | ○ | ○ | ○ | ○ | ○ | ○ | ○ | ○ | ◎ | ◎ | ◎ |
| | 76 | ◎ | ○ | ○ | ○ | ○ | ○ | ○ | ○ | ○ | ◎ | ◎ | ○ |
| Comp. Example | 11 | Δ | ○ | Δ | Δ | Δ | ○ | Δ | Δ | Δ | Δ | Δ | ○ |
| | 12 | Δ | ○ | Δ | Δ | Δ | ○ | Δ | Δ | Δ | Δ | Δ | ○ |
| | 13 | Δ | ○ | ○ | Δ | Δ | Δ | Δ | Δ | Δ | Δ | Δ | Δ |
| | 14 | Δ | Δ | Δ | Δ | Δ | ○ | Δ | Δ | Δ | Δ | Δ | ○ |
| | 15 | Δ | Δ | Δ | Δ | Δ | Δ | Δ | Δ | Δ | Δ | Δ | Δ |
| | 16 | Δ | ○ | ○ | Δ | Δ | Δ | Δ | Δ | Δ | Δ | Δ | Δ |

TABLE 10

| | | Rolling degree (%) | Ratio of pre-heat treating temp. relative to m.p. | Primary drawing degree (%) | Secondary drawing degree (%) | Drawing rate (m/min) | Difference of tension before and after dies (MPa) | Drawing angle (°) | Area reduction ratio of dies | | | Ratio of after-heat treating temp relative to recrystallization |
|---|---|---|---|---|---|---|---|---|---|---|---|---|
| | | | | | | | | | <7% | 7–11% | 11–20% | |
| Example | 61 | 98 | 50 | 95 | 99.8 | 200 | 1–5 | 20 | 40 | 40 | 20 | 50 |
| | 62 | 99 | 50 | 98 | 99.5 | 300 | 1–10 | 15 | 30 | 50 | 20 | 45 |
| | 63 | 99.9 | 55 | 99 | 99.7 | 250 | 2–20 | 25 | 20 | 50 | 30 | 60 |
| | 64 | 99 | 65 | 99.5 | 99.5 | 200 | 0.1–2 | 20 | 35 | 40 | 25 | 45 |
| | 65 | 98 | 40 | 99.9 | 99.99 | 300 | 1–5 | 20 | 60 | 20 | 20 | 50 |
| | 66 | 99 | 35 | 98.5 | 99.9 | 400 | 1–5 | 20 | 45 | 40 | 15 | 45 |
| | 67 | 98 | 50 | 99.8 | 99.995 | 300 | 0.5–5 | 20 | 40 | 40 | 20 | 55 |
| | 68 | 98 | 45 | 99.8 | 99.8 | 300 | 1–5 | 25 | 40 | 40 | 15 | 45 |
| | 69 | 99 | 50 | 99.9 | 99.9 | 250 | 1–10 | 20 | 40 | 40 | 20 | 65 |
| | 70 | 99 | 50 | 99.99 | 99.9 | 300 | 5–15 | 20 | 35 | 50 | 15 | 45 |
| | 71 | 99 | 60 | 99 | 99.95 | 400 | 1–5 | 20 | 40 | 40 | 20 | 40 |
| | 72 | 98 | 50 | 99.5 | 99.5 | 300 | 2–20 | 20 | 50 | 30 | 20 | 48 |
| | 73 | 99.5 | 45 | 98.8 | 99 | 150 | 1–5 | 20 | 40 | 30 | 30 | 45 |
| | 74 | 98 | 65 | 99 | 99.5 | 600 | 5–45 | 5 | 50 | 35 | 15 | 35 |
| | 75 | 99 | 65 | 99.8 | 99.5 | 650 | 3–20 | 20 | 65 | 25 | 10 | 30 |
| | 76 | 98 | 70 | 99.5 | 99.5 | 700 | 2–35 | 20 | 70 | 15 | 15 | 35 |
| Comp. Example | 11 | 80 | — | 90 | 97 | 100 | 0.5–1 | 20 | 80 | 20 | 0 | 80 |
| | 12 | 99 | 10 | 97 | 97 | 80 | 3–20 | 45 | 50 | 50 | 0 | 50 |
| | 13 | 98 | 50 | 93 | 99 | 200 | 0.08–10 | 60 | 75 | 5 | 20 | 60 |
| | 14 | 98 | 90 | 99 | 90 | 300 | 8–65 | 20 | 5 | 75 | 20 | 40 |
| | 15 | 98 | 50 | 93 | 99.5 | 1200 | 0.03–1 | 20 | 40 | 40 | 20 | 25 |

Briefly described below are the concrete steps of production according to the Examples. First, an ingot of a diameter of 6 to 30 mm was prepared. In the step of rolling, the ingot was rolled by using a thin roll at a rate of 10 to 100 m/min until the wire diameter was 0.5 to 1.5 mm. In the step of pre-heat treatment, the wire was held in an oven heating furnace set at 250 to 800° C. for 0.1 to 2 hours, and was left to cool in the open air outside the furnace. In the step of drawing, the wire was drawn at a rate in a range of 50 to 400 m/sec while maintaining a difference in the tension before and after the dies in a range of 0.1 to 50 MPa by using a continuous drawing device capable of setting a plurality of dies and by using the dies coated with diamond. The area reduction ratio of the dies that were used included three kinds of dies groups having area reduction ratios of smaller than 7%, 7 to 11% and 11 to 20%. In the after-heat treatment, an infrared heating furnace was used having a homogeneously heating zone of 20 cm. The wire was continuously moved and heat-treated through the furnace set at 250 to 700° C. at a rate of 50 to 800 m/min, such that the elongation in the tension testing was 3 to 5%.

In Examples 64, 65 and 70 to 76 in Table 10, the heating temperature Te at both ends of the heating furnace in the step of after-heat treatment was so adjusted as to be lower by 0.02 Tm to 0.3 Tm than the heating temperature Tm at the central portion.

To connect the bonding wires, there was used a general-purpose automatic wire bonding device to effect the ball/wedge junction. In the ball junction, a ball was formed at an end of the wire by an arc discharge, and the ball was joined to an electrode film by thermal press-adhesion also utilizing ultrasonic waves. Further, the other end of the wire was wedge-joined to a lead frame (Cu alloy) or to a lead portion on a CSP tape substrate. Narrow-pitch connections were effected while maintaining gaps among the electrodes of 70, 50 and 40 μm.

The counterpart to be joined was an electrode film on the silicon substrate, i.e., an Al alloy film (Al-1% Si, Al-0.5% Cu, Al-1% Si-0.5% cu) having a thickness of about 0.8 μm, or a Cu wiring (Au 0.01 μm/Ni 0.4 μm/Cu 0.4 μm).

To form stud bumps, the balls were joined onto the electrodes, and the wires were pulled up just thereon and were broken to form the bumps. When the stud bumps and the loops were formed in a mixed manner on the same chip to mount a laminated-layer chip, the stud bumps were, first, formed on all electrodes and, then, the loops were formed by joining the ball portions to the lead portions followed by wedge-joining the wires onto the stud bumps.

As for the wire structure, a wire polished in cross section in the lengthwise direction was etched and was checked for the number of crystal grains as observed by using a SEM. Further, a region of the sample of which the cross section was polished in the same manner was measured for its crystal orientations by the EBSP method. The area ratio of crystal grains of the orientation [111] or the orientation [100] was found on the whole cross section of the wire. A portion from the center of the wire having a radius R up to R/2 was regarded to be the central portion and the outer side thereof was regarded to be the outer peripheral portion in order to find the area ratios Rc and Rs [111]/[100] in the respective regions. A region from the center of the wire up to R/3 was regarded to be the core portion, and the area ratio Rd of [111]/[100] was found in the core region. In measuring the crystal orientations, the crystal grains having orientations inclined within 10° relative to the lengthwise direction of the wire were all regarded to be the crystal grains in each of the orientations.

To evaluate the wedge junction, the counterpart for being joined was a lead frame of which the surface had been plated with Ag (thickness of 1 to 4 μm) or a resin tape substrate of which the surface had been plated with Au/Ni/Cu wiring. The stage on which the sample was mounted was maintained at an ordinarily employed temperature of 220° C. in the case of the lead frame, and, in the case of the tape substrate, at an ordinarily employed temperature of 180° C. and at 160° C. at which the wedge junction became more severe. Ten 200-pin chips were used as a reference for evaluation and a total of 2000 wires were connected. When the continuous bonding operation was interrupted even once due to defective wedge junction or when defects such as peeling were recognized at two or more places as observed by using an optical microscope, it was judged to be caused by insufficient wedge junction and the wedge junction was denoted by Δ. When there was no problem in the continuous bonding and no defect was observed, it was judged that the wedge junction was good and was denoted by ⊚. When the continuous bonding was accomplished but when the peeling was observed at one place, which was in between the above two cases, no problem was caused and, hence, the wedge junction was denoted by ○.

As for the formation of balls that affect the wedge junction, the wedge was joined to the tape substrate at a temperature as low as 160° C., and ten small balls 1.4 times as large as the wire diameter were observed through a SEM. The sphericality of balls were denoted by ⊚ when balls were of a truly spherical shape and were favorable, were denoted by Δ when even one flat ball was observed, and were denoted by ○ when two or more balls which were of a truly spherical shape and were favorable but were deviated from the center of the wire were observed.

As for the measurement of the wire sweep at the time of being molded with the resin, the wires were bonded while maintaining a length of about 5 mm so as to form loops of a trapezoidal shape and maintaining a loop height of about 300 μm. Thereafter, the sample was molded with a general-purpose biphenyl epoxy resin by using a molding device. Then, the interior of the semiconductor element was projected with X-rays by using a soft X-ray non-destructive inspection device, and the sweeping amount of wires at predetermined positions was measured for 30 samples, and a value (percentage) obtained by dividing an average value thereof by the wire was defined as a wire sweep after the molding. The wire sweep of smaller than 4% was judged to be good and was denoted by ⊚. The wire sweep of not smaller-than 6% was denoted by Δ because, in this case, it was probable that the wires come in contact in the narrow-pitch connection, and the intermediate wire sweep in a range of 4 to 6% was denoted by ○.

To evaluate the linearity of the bonded loops, a hundred wires bonded while maintaining a wire length (span) of 6 mm were observed from the upper side by using a projector. Deviations of portions where the wires were most separated were measured as bending amounts relative to the lines connecting the junction portions on the ball side and on the wedge side. The average bending amount smaller than a wire diameter was judged to be favorable and was denoted by ⊚, the average bending amount not smaller than two wire diameters was judged to be defective and was denoted by Δ, and the average bending amount lying in between was judged to be good causing no problem and was denoted by ○.

To evaluate the reliability of wedge junction portion, a high-temperature reflow testing and a heat cycle testing were conducted. The samples were obtained by bonding the wires onto a lead frame of a Cu alloy having 200 pins followed by being molded with a general-purpose biphenyl epoxy resin. The samples were two chips with a total of 400 pins. In the reflow testing, the reflowing was conducted at 280° C. which was higher than that for the conventional Sn—Pb eutectic to cope with the Pb-free solder and, then, the electric properties were measured. The reliability was denoted by Δ when even one wire without electric conduction was present, was denoted by ⊚ when there was no problem concerning the electric characteristics, and was denoted by ○ when the situation was between the above two cases where the electric conduction was accomplished by all pins but there were two or more pins having high electric resistance because a worse junction reliability could be considered.

In the heat cycle testing, the temperature was elevated and lowered repetitively between –55° C. and 125° C. in order to evaluate the thermal hysteresis during the practical use in an accelerated manner. After the testing for 300 cycles, the mold was disintegrated to remove the resin, and the tensile testing (peel testing) was conducted near the wedge junction portion. The peel strength of the wedge junction after the heat cycle testing was compared with an average value just after the bonding. When a reduction in the peel strength after the testing was not larger than 20%, the wear resistance at the wedge junction portion was favorable and the reliability was denoted by ⊚. When a reduction in the strength was greater than 70%, the occurrence of defect was probable and the reliability was denoted by Δ, and was denoted by ○ when the situation was between the above two cases since the electric connection could be maintained.

Peel testing was conducted to evaluate the tensile strength near the wedge junction portion with a short span. The chip step was about 450 μm, the wire length was about 1 mm and the counterpart to be joined was the above resin tape. The peel testing was conducted with the bonded wires, and the tensile strength was judged to be good and denoted by ⊚ when the peel strength, which is a breaking strength, not smaller than 60 mN, was judged to involve a problem in practice and was denoted by Δ when the peel strength was smaller than 20 mN, and was judged to be of a level without practical problem and was denoted by ○ when the situation was between the above two cases.

As for the leaning which is a phenomenon in which the wire-erecting portion falls near the ball junction, the ball-erecting portion was observed from a horizontal direction of the chip, and a maximum gap (leaning gap) was evaluated between a perpendicular passing through the center of the ball junction portion and the wire-erecting portion. The wire length was 4 mm and the number of the samples was 50. The leaning was evaluated for two kinds of cases, i.e., the loops having an ordinarily employed maximum height of about 220 μm and the loops having a height of about 350 μm which was severer for evaluating the leaning. The leaning was judged to be favorably suppressed when the leaning gap was smaller than the wire diameter, and was judged to be defective when the leaning gap was larger than the wire diameter since the erecting portion has been inclined. Depending upon the frequency of occurrence of defective leaning, the leaning was denoted by Δ when the defect has occurred at three or more portions, was denoted by ⊚ when no defect has occurred, and was denoted by ○ when the situation was between the above two cases.

As for the adaptability to the laminated-layer chip connection, the wire bending was evaluated at the time of reverse step bonding. A stud bump was formed on the electrode such that the ball junction portion was located at a position lower than the wedge junction portion, and a wedge was joined thereon. By using a chip having a step as high as 450 μm, the wire was bonded such that the wire-erecting portion was about 350 μm near the ball junction. Two hundred bonded wires were observed from the upper direction, and the wire bending was judged to be defective and was denoted by Δ when there was even one erecting portion inclined by an amount of not less than 4 times the wire diameter, was judged to be good and was denoted by ⊚ when a maximum bending amount of all wires was not larger than 2 times the wire diameter, and was judged to involve no problem in the general use and was denoted by ○ when the situation was between the above two cases though bending occurred to some extent.

As for the scars on the surface of the wire, a hundred loops were formed and were observed by using the SEM. The wire surface was denoted by ⊚ when no scar was recognized on the wire surface, was denoted by Δ when even one scar longer than 10 μm was recognized, and was denoted by ○ when the situation was between the above two cases judging that there was no problem of developing scars. As for the clogging of capillaries, the numbers of times of bonding were compared until defects, related to the clogging of capillaries occurred, such as until it became difficult to continue the bonding or until the shapes of the loops were disturbed, occurred. The capillary clogging was denoted by Δ when the number of times was smaller than 100,000 judging that the capillary life was short and the productivity was poor, denoted by ⊚ when the number of times was not smaller than 500,000 judging that the productivity was good, and was denoted by ○ when the situation was between the above two cases judging that no problem was involved in ordinary use.

As for the stability in the shape of the loops in the bonding step, the height of the loop was measured at three places for each of the wires, and the stability was evaluated based on a standard deviation of the loop height. To evaluate the practical application to a narrow-pitch long-span connection with which it was more difficult to stabilize the shape of the loops, the wires were bonded in two kinds, i.e., a wire length of 5 mm, forming loops of a trapezoidal shape maintaining loop heights of about 200 μm and about 350 μm. Groups each including 50 loops were selected and measured by using an optical microscope. Measurement was taken at three places where the loop height tended to be dispersed, i.e., a portion just on the ball, a portion of a maximum height that could be reached and a central portion in the wire length.

When a standard deviation of the loop height was not smaller than one-half the wire diameter, it was so judged that the dispersion was great and when the standard deviation of the loop height was smaller than one-half thereof, it was so judged that the dispersion was small and the loop stability was good. On the basis of this judgement, when the dispersion was small at three places, it was so judged that the loop shape was stable and was denoted by ⊚. When there was one place where the dispersion was great, it was so judged that the loop shape was relatively good and was denoted by ○. When there were two places where the dispersion was great, the loops were denoted by Δ and when the dispersion was great on three places, the loops were denoted by X.

In Tables 8, 9 and 10, the bonding wires related to the invention (15) are Examples 61 to 76, the bonding wires related to the invention (16) are Examples 61 to 63, 65 to 69 and 72 to 74, the bonding wires related to the invention (17) are Examples 61 to 67 and 70 to 73, the bonding wires related to the invention (18) are Examples 61 to 70 and 72, the bonding wires related to the invention (19) are Examples 64, 71, 75 and 76, and the bonding wires related to the invention (21) are Examples 61, 62, 64 to 70 and 72 to 76. Comparative Examples 11 to 16 in Table 8 are those in which the structural constitutions of the bonding wires of the invention (15) are not satisfied.

In the bonding wires of Examples 61 to 76, the absolute value |1−Rc/Rs|×100(%) of the differential ratio of the area ratios Rc and Rs of [111]/[100] at the center of the wire and at the outer peripheral portion thereof was not smaller than 30%, and it was confirmed that the wedge junction could be improved when there was used a lead frame which is chiefly used at present. Small balls of about 1.3 times as great as the wire diameter could be favorably formed, too. In Examples 62 to 68, 70, 72, 75 and 76 in which the absolute values of the differential ratios of the crystal orientations were not smaller than 40%, the wedge junction had been improved when the wires were bonded onto the resin tape at 180° C. Further, in Examples 63 to 67, 70 and 76, in which the absolute values of the differential ratios of the crystal orientations were not smaller than 50%, the wedge junction onto the resin tape had been improved even at a lower temperature of 160° C. In the bonding wires of Comparative Examples 11 to 16, on the other hand, as the absolute value of the differential ratio of the crystal orientations was smaller than 30%, the wedge junction to the lead frame or to the resin tape was not sufficient.

In the bonding wires of Examples 61 to 63, 65 to 69 and 72 to 74 related to the invention (16), the absolute value |1−Rc/Rs|×100(%) of the differential ratio the area ratios Rc and Rs of [111]/[100] at the center and at the outer peripheral portion was not smaller than 30% and the area ratio Ra of [111]/[100] on the whole cross section of the wire on average was not smaller than 1.0. Therefore, the junction could be improved while suppressing the wire sweep. In Comparative Examples 11 to 16, however, such an improvement could not be recognized. In Examples 61 and 66 to 69, the value Ra was set to be not smaller than 1.2 on average on the whole cross section of the wire, and the linearity of the loops could be improved while maintaining a long span.

In the bonding wires of Examples 61 to 67 and 70 to 73 related to the invention (17), the differential ratio |1−Rc/Rs|×100(%) of the area ratios Rc and Rs at the center and at the outer peripheral portion was not smaller than 30% and the area ratio Rd in the core portion from the center of the wire up to R/3 was in a range of from 0.1 to 0.8. It was therefore confirmed that the wedge junction could be enhanced while suppressing the wire sweep and, besides, good reliability was obtained in the high-temperature reflow testing related to the wear characteristics in the wedge junction and in the heat cycle testing. In Examples 61 to 63, 65 to 67, 72 and 73 among them, it was confirmed that the peel strength was sufficiently large near the wedge junction portions maintaining a short span as a result of setting an average area ratio Ra [111]/[100] on the whole cross section of the wire to be not smaller than 1.0 in addition to satisfying the differential ratio between the central portion and the outer peripheral portion, and satisfying the area ratio Rd in the core portion.

In the bonding wires of Examples 61 to 70 and 72 related to the invention (18), the differential ratio |1−Rc/Rs|×100(%) of the area ratios Rc and Rs at the center and at the outer peripheral portion was not smaller than 30% and the area ratio Rs in the outer peripheral portion was not smaller than 1.2. It was therefore confirmed that the wedge junction was satisfied and the leaning could be improved with the loop height of 200 μm. Among them, the bonding wires of Examples 65 to 68 having an Rs of not smaller than 1.5 made it possible to obtain good leaning even when the loop height was as high as about 350 μm. In Examples 61 to 67, 70 and 72 in which |1−Rc/Rs|×100(%)≧30%, Rs≧1.2 and the ratio Rd in the core portion was in a range of 0.1 to 0.8, there was exhibited the effect for lowering the wire bending at the time of inverse step bonding.

In the bonding wires of Examples 64, 71, 75 and 76 related to the invention (19), the area ratio Rt [111]/[100] in the outermost portion of from the surface up to R/5 was not larger than 1.0, making it possible to lower the occurrence of scars on the wire surfaces, to extend the life before the capillaries are clogged and, hence, to increase the productivity.

In the bonding wires of Examples 61, 62, 64 to 70 and 72 to 76 related to the invention (21), the differential ratio |1−Rc/Rs|×100(%) of area ratios Rc and Rs in the central portion and in the outer peripheral portion was not smaller than 30%, and the number of crystal grains was in a range of 0.04 to 4 per $\mu m^2$. It was therefore confirmed that dispersion in the height of the loops could be decreased while maintaining the wire length of 5 mm and the shape of the loops could be favorably controlled while maintaining stability.

INDUSTRIAL APPLICABILITY

According to the gold bonding wires for semiconductor devices and the method of producing the same of the present invention, it is possible to increase the strength and modulus of elasticity, suppress the wire sweep, suppress the leaning at the ball-erecting portions and to totally improve the junction of the wedge junction portions or wear characteristics, and to enhance the productivity on an industrial scale.

The invention claimed is:

1. A gold bonding wire for a semiconductor device wherein, in a crystal grain structure in cross section in the lengthwise direction of the bonding wire, a ratio of the area of crystal grains having an orientation [111] to the area of crystal grains having an orientation [100] is not smaller than 1.2 in the crystal orientations in the lengthwise direction of the wire.

2. A gold bonding wire for a semiconductor device according to claim 1 wherein, in a crystal grain structure in cross section in the lengthwise direction of the bonding wire, an area ratio of crystal grains having an orientation [111] is not smaller than 55% in the crystal orientations in the lengthwise direction of the wire.

3. A gold bonding wire for a semiconductor device according to claim 1 wherein, in a crystal grain structure in cross section in the lengthwise direction of the bonding wire, if the radius of the wire is denoted by R and a portion up to R/2 from the center of the wire is regarded to be a central portion, then, a ratio Rc of the area of crystal grains having an orientation [111] to the area of crystal grains having an orientation [100] in the crystal orientations at the central portion in the lengthwise direction of the wire and a ratio Ra of the area of crystal grains having an orientation [111] to the area of crystal grains having an orientation [100] on the whole cross section of the wire, are such that an absolute value $|1-Rc/Ra|\times100(\%)$ of a differential ratio between the two is smaller than 30%, and the ratio Ra is not smaller than 1.2 on the whole cross section of the wire.

4. A gold bonding wire for a semiconductor device according to any one of claims 1 to 3, wherein, in a crystal grain structure in cross section in the lengthwise direction of the bonding wire, if the radius of the wire is denoted by R, there exists, in at least one or more layers, a region in which a ratio of the area of crystal grains having an orientation [111] to the area of crystal gains having an orientation [100] is not smaller than 1.6 in the crystal orientations in the lengthwise direction of the wire maintaining a width of not smaller than 1/10 of the radius R of the wire in the radial direction of the wire.

5. A gold bonding wire for a semiconductor device according to any one of claims 1 to 3, wherein, in a crystal grain structure in cross section in the lengthwise direction of the bonding wire, if the radius of the wire is denoted by R, there exists, in at least one or more layers, a region in which an area ratio of crystal grains having an orientation [111] is not smaller than 60% in the crystal orientations in the lengthwise direction of the wire maintaining a width of not smaller than 1/10 of the radius R of the wire in the radial direction of the wire.

6. A gold bonding wire for a semiconductor device according to any one of claims 1 to 3, wherein, in a crystal grain structure in cross section in the lengthwise direction of the bonding wire, if the radius of the wire is denoted by R, there exists, in at least one or more layers, a region in which a ratio of the area of crystal grains having an orientation [111] to the area of crystal gains having an orientation [100] is smaller than 0.9 in the crystal orientations in the lengthwise direction of the wire maintaining a width of not smaller than 1/10 but smaller than 1/3 of the radius R of the wire in the radial direction of the wire.

7. A gold bonding wire for a semiconductor device according to any one of claims 1 to 3, wherein, in a crystal grain structure in cross section in the lengthwise direction of the bonding wire, if the radius of the wire is denoted by R, there exists, in at least one or more layers, a region in which an area ratio of crystal grains having an orientation [100] is not smaller than 50% in the crystal orientations in the lengthwise direction of the wire maintaining a width of not smaller than 1/10 of the radius R of the wire in the radial direction of the wire.

8. A gold bonding wire for a semiconductor device according to claim 7, wherein, in cross section in the lengthwise direction of the bonding wire, a ratio of the sum of areas of crystal grains having an orientation [111] and an orientation [100] is not smaller than 50% in the crystal orientations in the lengthwise direction of the wire.

9. A gold bonding wire for a semiconductor device according to any one of claims 1 to 3, wherein, in cross section in the lengthwise direction of the bonding wire, a ratio of the sum of areas of crystal grains having an orientation [111] and an orientation [100] is not smaller than 50% in the crystal orientations in the lengthwise direction of the wire.

10. A gold bonding wire for a semiconductor device according to claim 9, wherein, in cross section in the lengthwise direction of the wire greater by more than 5 times than the diameter of the bonding wire, there are included at least two or more crystal grains of which the crystal orientations are oriented within an angle of 15° in the lengthwise direction of the wire over a length of not smaller than 70% of the wire diameter.

11. A gold bonding wire for a semiconductor device according to claim 9, wherein, the number of crystal grains on a cross section perpendicular to the lengthwise direction of the bonding wire is from 0.04 to $4/\mu m^2$.

12. A gold bonding wire for a semiconductor device according to any one of claims 1 to 3, wherein in cross section in the lengthwise direction of the bonding wire, if the radius of the wire is denoted by R and a portion up to R/2 from the center of the wire is regarded to be a central portion, a ratio of the sum of areas of crystal grains having an orientation [111] and an orientation [100] occupying the central portion is not smaller than 60% in the crystal orientations in the central portion in the lengthwise direction of the wire.

13. A gold bonding wire for a semiconductor device according to claim 1 wherein, in a crystal grain structure in cross section in the lengthwise direction of the bonding wire, if the radius of the wire is denoted by R and a portion of a depth up to R/3 from the surface of the wire is regarded to be a surface layer portion, a ratio of the area of crystal grains having an orientation [111] to the area of crystal grains having an orientation [100] is not smaller than 1.6 in the crystal orientations in the surface layer portion in the lengthwise direction of the wire, and a ratio of the area of crystal grains having the orientation [111] to the area of crystal grains having the orientation [100] is not smaller than 1.2 on the whole cross section of the wire.

14. A gold bonding wire for a semiconductor device according to any one of claims 1 to 3 and 13, wherein, in cross section in the lengthwise direction of the bonding wire, if the radius of the wire is denoted by R and a portion up to R/3 from the surface of the wire is regarded to be a surface region, a ratio of the sum of areas of crystal grains having an orientation [111] and an orientation [100] occupying the surface region is not smaller than 50% in the crystal orientations in the surface region in the lengthwise direction of the wire.

15. A gold bonding wire for a semiconductor device according to any one of claims 1 to 3, and 13, wherein, in cross section in the lengthwise direction of the wire greater by more than 5 times than the diameter of the bonding wire, there are included at least two or more crystal grains of which the crystal orientations are oriented within an angle of 15° in the lengthwise direction of the wire over a length of not smaller than 70% of the wire diameter.

16. A gold bonding wire for a semiconductor device according to any one of claims 1 to 3, and 13, wherein, the bonding wire contains Au as a chief component, contains one or more elements selected from Y, Ca, Yb and Eu at a total concentration $C_1$ of 0.002 to 0.03% by mass, and contains one or more elements selected from La, Tb, Dy and Nd at a total concentration $C_2$ of 0.002 to 0.05% by mass, the concentrations of the added components being in a range of $0.1 < C_1/C_2 < 10$.

17. A gold bonding wire for a semiconductor device according to claim 1 wherein, in a crystal grain structure in cross section in the lengthwise direction of the bonding wire, if the radius of the wire is denoted by R, a portion up to R/2 from the center of the wire is regarded to be a central portion and the outer side thereof is regarded as an outer peripheral portion, then, a ratio Rc of the area of crystal grains having an orientation [111] to the area of crystal grains having an orientation [100] in the crystal orientations at the central portion in the lengthwise direction of the wire and a ratio Rs of the area of crystal grains having the orientation [111] to the area of crystal grains having the orientation [100] in the crystal orientations in the outer peripheral portion in the lengthwise direction of the wire, are such that an absolute value |1−Rc/Ra|×100(%) of a differential ratio between the two is not smaller than 30%.

18. A gold bonding wire for a semiconductor device according to claim 17 wherein, in a crystal grain structure in cross section in the lengthwise direction of the bonding wire, if the radius of the wire is denoted by R and a portion up to R/3 from the center of the wire is regarded to be a core portion, a ratio Rd of the area of crystal grains having an orientation [111] to the area of crystal grains having an orientation [100] is in a range of from 0.1 to 0.8 in the crystal orientations in the core portion in the lengthwise direction of the wire.

19. A gold bonding wire for a semiconductor device according to claim 17, wherein, a ratio Rs of the area of crystal grains having an orientation [111] to the area of crystal gains having an orientation [100] is not smaller than 1.2 in the crystal orientations in the outer peripheral portion of the bonding wire in the lengthwise direction of the wire.

20. A gold bonding wire for a semiconductor device according to claim 17, wherein, in a crystal grain structure in cross section in the lengthwise direction of the bonding wire, if the radius of the wire is denoted by R and a portion up to R/5 from the surface of the wire is regarded to be the outermost surface portion, a ratio Rt of the area of crystal grains having an orientation [111] to the area of crystal grains having an orientation [100] is not larger than 1.0 in the crystal orientations in the outermost portion in the lengthwise direction of the wire.

21. A gold bonding wire for a semiconductor device according to any one of claims 1 to 3, 13, and 17, wherein, an orientation [111] and an orientation [100] of the crystal grains are inclined within 10° with respect to the lengthwise direction of the bonding wire.

22. A gold bonding wire for a semiconductor device according to any one of claims 1 to 3, 13, and 17, wherein, the number of crystal grains on a cross section perpendicular to the lengthwise direction of the bonding wire is from 0.04 to $4/\mu m^2$.

* * * * *